(12) United States Patent
Baek et al.

(10) Patent No.: US 8,778,711 B2
(45) Date of Patent: Jul. 15, 2014

(54) METHOD FOR MAKING DISPLAY APPARATUS HAVING MULTIPLE SPACERS

(71) Applicant: Samsung Display Co., Ltd., Yongin (KR)

(72) Inventors: Ju-Hyeon Baek, Cheonan-si (KR); Keum-Dong Jung, Seoul (KR); Jong-Hwan Lee, Anyang-si (KR); Kyung-Wook Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/153,557

(22) Filed: Jan. 13, 2014

(65) Prior Publication Data

US 2014/0127840 A1    May 8, 2014

Related U.S. Application Data

(62) Division of application No. 12/894,665, filed on Sep. 30, 2010, now Pat. No. 8,629,447.

(30) Foreign Application Priority Data

Dec. 30, 2009 (KR) .................. 10-2009-0133924

(51) Int. Cl.
| | | |
|---|---|---|
| H01L 21/00 | (2006.01) | |
| H01L 21/687 | (2006.01) | |
| H01L 21/56 | (2006.01) | |
| H01L 27/12 | (2006.01) | |

(52) U.S. Cl.
CPC ...... *H01L 21/68735* (2013.01); *H01L 21/6875* (2013.01); *H01L 21/563* (2013.01); *H01L 27/1214* (2013.01)
USPC ........... 438/30; 438/34; 438/28; 257/E21.535

(58) Field of Classification Search
CPC ............ H01L 21/563; H01L 21/68735; H01L 21/6875; H01L 27/12; H01L 27/1214
USPC ................ 438/30, 34, 28, 118; 257/E33.055, 257/E33.062, 59, 72, E21.535; 349/155–157
See application file for complete search history.

(56) References Cited

U.S. PATENT DOCUMENTS

| | | |
|---|---|---|
| 7,133,108 B2 | 11/2006 | Shimizu et al. |
| 7,385,666 B2 | 6/2008 | Ashizawa et al. |

(Continued)

FOREIGN PATENT DOCUMENTS

| | | |
|---|---|---|
| JP | 2005-201982 | 7/2005 |
| JP | 2007-171715 | 7/2007 |

(Continued)

OTHER PUBLICATIONS

Non-Final Office Action issued on Aug. 1, 2012 in U.S. Appl. No. 12/894,665.

(Continued)

*Primary Examiner* — Shouxiang Hu
(74) *Attorney, Agent, or Firm* — H.C. Park & Associates, PLC

(57) ABSTRACT

A display apparatus includes a display substrate and a counter substrate. The display substrate includes a first substrate and a plurality of pixel electrodes formed on the first substrate. The counter substrate includes a second substrate facing the first substrate, a common electrode formed on the second substrate, a first spacer formed on the common electrode and making contact with the display substrate, a second spacer having a first gap with the display substrate, a third spacer having a second gap larger than the first gap with the display substrate, and a fourth spacer having a third gap larger than the second gap with the display substrate.

10 Claims, 20 Drawing Sheets

(56) References Cited

U.S. PATENT DOCUMENTS

| | | | |
|---|---|---|---|
| 7,433,004 B2 | 10/2008 | Tsubata et al. | |
| 2004/0114087 A1* | 6/2004 | Cho et al. | 349/155 |
| 2005/0237470 A1 | 10/2005 | Kadotani | |
| 2008/0002136 A1 | 1/2008 | Lee | |
| 2008/0007687 A1 | 1/2008 | Konno | |
| 2009/0091677 A1 | 4/2009 | Cho et al. | |
| 2009/0268131 A1 | 10/2009 | Tsai et al. | |
| 2010/0033668 A1* | 2/2010 | Koito et al. | 349/155 |
| 2010/0103364 A1* | 4/2010 | Choi et al. | 349/157 |

FOREIGN PATENT DOCUMENTS

| | | |
|---|---|---|
| KR | 10-0840931 | 4/2004 |
| KR | 1020050063575 | 6/2005 |
| KR | 1020050065828 | 6/2005 |
| KR | 1020050086319 | 8/2005 |
| KR | 1020060045831 | 5/2006 |
| KR | 1020060066271 | 6/2006 |
| KR | 1020070071783 | 7/2007 |
| KR | 10-0920481 | 11/2007 |
| KR | 1020080082086 | 9/2008 |
| KR | 1020090060159 | 6/2009 |

OTHER PUBLICATIONS

Final Office Action issued on Jan. 11, 2013 in U.S. Appl. No. 12/894,665.

Non-Final Office Action issued on Apr. 11, 2013 in U.S. Appl. No. 12/894,665.

Notice of Allowance issued on Sep. 16, 2013 in U.S. Appl. No. 12/894,665.

* cited by examiner

METHOD FOR MAKING DISPLAY APPARATUS HAVING MULTIPLE SPACERS

CROSS REFERENCE TO RELATED APPLICATIONS

This application is a divisional of U.S. application Ser. No. 12/894,665, filed on Sep. 30, 2010, and claims priority from and the benefit of Korean Patent Application No. 10-2009-133924, filed on Dec. 30, 2009, which is hereby incorporated by reference for all purposes as if fully set forth herein.

BACKGROUND OF THE INVENTION

1. Field of the Invention

Exemplary embodiments of the present invention relate to a display apparatus and a method for manufacturing the display apparatus. More particularly, exemplary embodiments relate to a display apparatus enhancing a dropping margin and a method for manufacturing the display apparatus.

2. Discussion of the Background

Generally, a liquid crystal display (LCD) apparatus includes a display panel to display an image using light transmittance of a liquid crystal, and a backlight assembly disposed under the display panel and to provide light to the display panel.

The display panel may include a display substrate, a counter substrate, and a liquid crystal layer disposed between the display substrate and the counter substrate. The display substrate may include a plurality of pixel electrodes and thin-film transistors (TFTs) electrically connected to the pixel electrodes. The counter substrate may include a common electrode and a plurality of color filters. A cell gap spacer may be disposed between the display substrate and the counter substrate so as to maintain a liquid crystal cell gap.

A dropping method is a method for receiving liquid crystal in a cell gap maintained by the cell gap spacer, and includes tightly combining the counter substrate with the display substrate by curing a seal line formed between the counter substrate and the display substrate after dropping the liquid crystal on the counter substrate.

In the dropping method, the liquid crystal dropped on the counter substrate may not be uniformly sprayed on the counter substrate by the cell gap spacer, so that a margin of the dropping process may be decreased. Thus, a volume of the cell gap spacer may be decreased to enhance the margin of the dropping process.

However, when the volume of the cell gap spacer is decreased, a smear defect may occur because the cell gap is not uniformly maintained by an external pressure. Accordingly, there is a trade-off relation between a margin of the liquid crystal injection process and a tolerance with respect to the external pressure, so that a structure for optimizing the margin and the tolerance at the same time would be beneficial.

SUMMARY OF THE INVENTION

Exemplary embodiments of the present invention provide a display apparatus enhancing a margin of a liquid crystal injection process and a tolerance with respect to an external pressure.

Exemplary embodiments of the present invention also provide a method for manufacturing the display apparatus.

Additional features of the invention will be set forth in the description which follows, and in part will be apparent from the description, or may be learned by practice of the invention.

An exemplary embodiment of the present invention discloses a display apparatus including a display substrate including a first substrate and a plurality of pixel electrodes disposed on the first substrate, and a counter substrate including a second substrate facing the first substrate, a common electrode formed on the second substrate, a first spacer extending from the common electrode and contacting the display substrate, a second spacer extending from the common electrode, wherein a first gap exists between the second spacer and the display substrate, a third spacer extending from the common electrode, wherein a second gap exists between the third spacer and the display substrate, the second gap being larger than the first gap, and a fourth spacer extending from the common electrode, wherein a third gap exists between the fourth spacer and the display substrate.

An exemplary embodiment of the present invention also discloses a method for manufacturing a display apparatus, the method including forming a display substrate including a plurality of pixel electrodes disposed on a first substrate, forming a counter substrate, the counter is substrate including a common electrode formed on a second substrate, a first spacer disposed on the common electrode, the first spacer being a first height, a second spacer disposed on the common electrode, the second spacer being a second height, wherein the second height is less than the first height, a third spacer disposed on the common electrode, the third spacer being a third height, wherein the third height is substantially the same as the first height, and a fourth spacer disposed on the common electrode, the fourth spacer being a fourth height, wherein the fourth height is substantially the same as the second height, and combining the display substrate and the counter substrate so that the first spacer contacts the display substrate, the second spacer is spaced apart from the display substrate by a first gap, the third spacer is spaced apart from the display substrate by a second gap larger than the first gap, and the fourth spacer is spaced apart from the display substrate by a third gap larger than the second gap.

An exemplary embodiment of the present invention also discloses a method for manufacturing a display apparatus, the method including forming a display substrate including a plurality of pixel electrodes disposed on a first substrate, forming a counter substrate, the counter substrate including a common electrode formed on a second substrate, a first spacer disposed on the common electrode, a second spacer disposed on the common electrode, a third spacer disposed on the common electrode, and a fourth spacer disposed on the common electrode, and combining the display substrate with the counter substrate so that the first spacer contacts the display substrate, the second spacer is spaced apart from the display substrate by a first gap, the third spacer is spaced apart from the display substrate by a second gap larger than the first gap, and the fourth spacer is spaced apart from the display substrate by a third gap larger than the second gap, wherein the first spacer, the second spacer, the third spacer, and the fourth spacer are substantially the same height.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
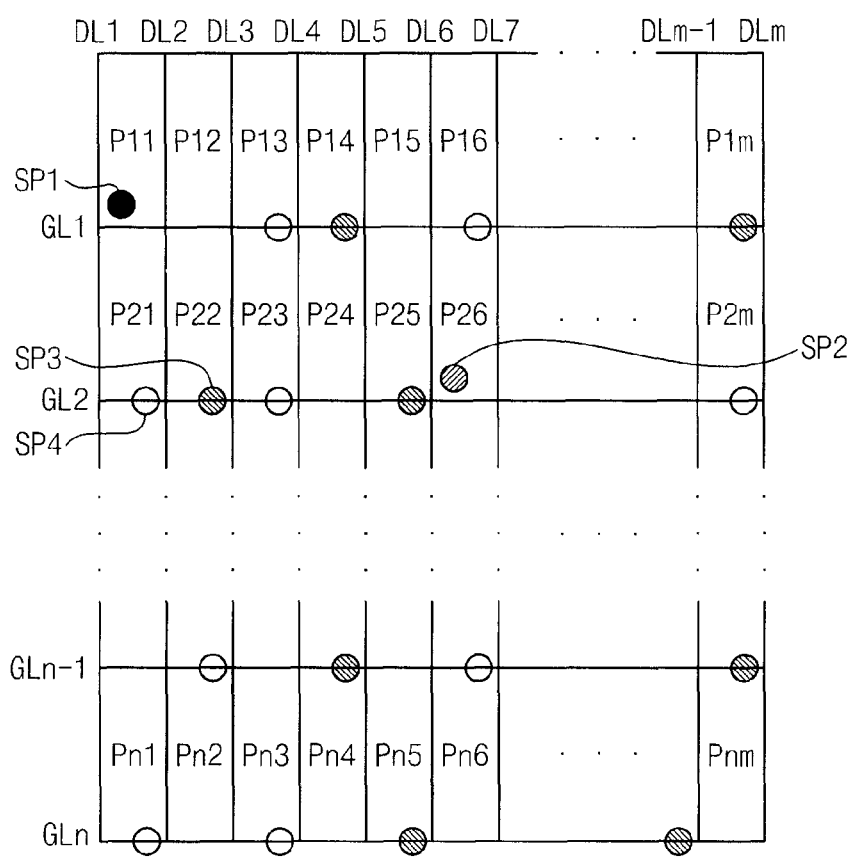
FIG. 1 is a plan view illustrating a display apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to" or "coupled to" another element or layer, it can be directly on, directly connected, or directly coupled to the other element or layer, or intervening elements or layers may be present. In contrast, when an element is referred to as being "directly on," "directly connected to," or "directly coupled to" another element or layer, there are no intervening elements or layers present.

As used herein, the term "and/or" may include any and all combinations of one or more of the associated listed items.

It will be understood that, although the terms first, second, third etc. may be used herein to describe various elements, components, regions, layers, and/or sections, these elements, components, regions, layers, and/or sections are not limited by these terms. These terms are only is used to distinguish one element, component, region, layer, or section from another element, component, region, layer or section. Thus, a first element, first component, first region, first layer, or first section discussed below could be termed, respectively, a second element, second component, second region, second layer, or second section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" can encompass both an orientation of above and below. The apparatus may be otherwise oriented (e.g., rotated 90 degrees or at other orientations) and the spatially relative descriptors used herein interpreted accordingly.

The terminology used herein is for the purpose of describing particular exemplary embodiments only and is not intended to limit the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, the present invention should not be construed as limited to the particular shapes of regions illustrated herein but is to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view illustrating a display apparatus according to an exemplary embodiment of the present invention.

Referring to FIG. 1, a display apparatus according to an exemplary embodiment includes a plurality of data lines DL1 to DLm, a plurality of gate lines GL1 to GLn crossing the data lines DL1 to DLm, a first spacer SP1, a second spacer SP2, a third spacer SP3 and a fourth spacer SP4. A plurality of pixel areas P11 to Pnm is defined by the gate lines GL1 to GLn and the data lines DL1 to DLm. The pixel areas P11 to Pnm are arranged in a 2-dimensional array along a plurality of rows and a plurality of columns. Here, n and m are natural numbers.

The data lines DL1 to DLm and the gate lines GL1 to GLn are formed on a display substrate, and the first spacer SP1, second spacer SP2, third spacer SP3, and fourth spacer SP4 are formed on a counter substrate facing the display substrate. The first spacer SP1, second spacer SP2, third spacer SP3, and fourth spacer SP4 are disposed in areas different from each other.

The first spacer SP1 is formed to make contact with the display substrate and maintains a cell gap between the display substrate and the counter substrate. Similar to the first spacer SP1, the second spacer SP2 maintains a cell gap between the display substrate and the counter substrate.

The second spacer SP2 is spaced apart from the display substrate by a first gap G1.

The first spacer SP1 and the second spacer SP2 are spaced apart by a constant gap. In an exemplary embodiment, the first spacer SP1 is formed in a pixel area P11 corresponding to a first row and a first column, and the second spacer SP2 is formed in a pixel area P26 corresponding to a second row adjacent to the first row and a sixth column. However, the present invention is not limited thereto.

A ratio of a density of the first spacer SP1 to a density of the second spacer SP2 is may be about 1:N (N is natural number) or about N:1. For example, the ratio of the density of the first spacer SP1 to the density of the second spacer SP2 may be about 1:1, about 1:2, about 1:3, about 3:1 or about 2:1. If the second spacer SP2 is denser than the first spacer SP1, a dropping margin may be enhanced.

The third spacer SP3 may be spaced apart from the display substrate by a second gap larger G2 than the first gap G1.

The fourth spacer SP4 may be spaced apart from the display substrate by a third gap G3 larger than the second gap G2.

In the case that a liquid crystal panel according to an exemplary embodiment of the present invention is subject to an external pressure, the third spacer SP3 and fourth spacer SP4 disperse the external pressure. The third spacer SP3 and fourth spacer SP4 are uniformly distributed in pixel areas except the pixel areas in which the first spacer SP1 and second spacer SP2 are disposed. The third spacer SP3 and fourth spacer SP4 are formed denser than the first spacer SP1 and second spacer SP2.

Figure 2:
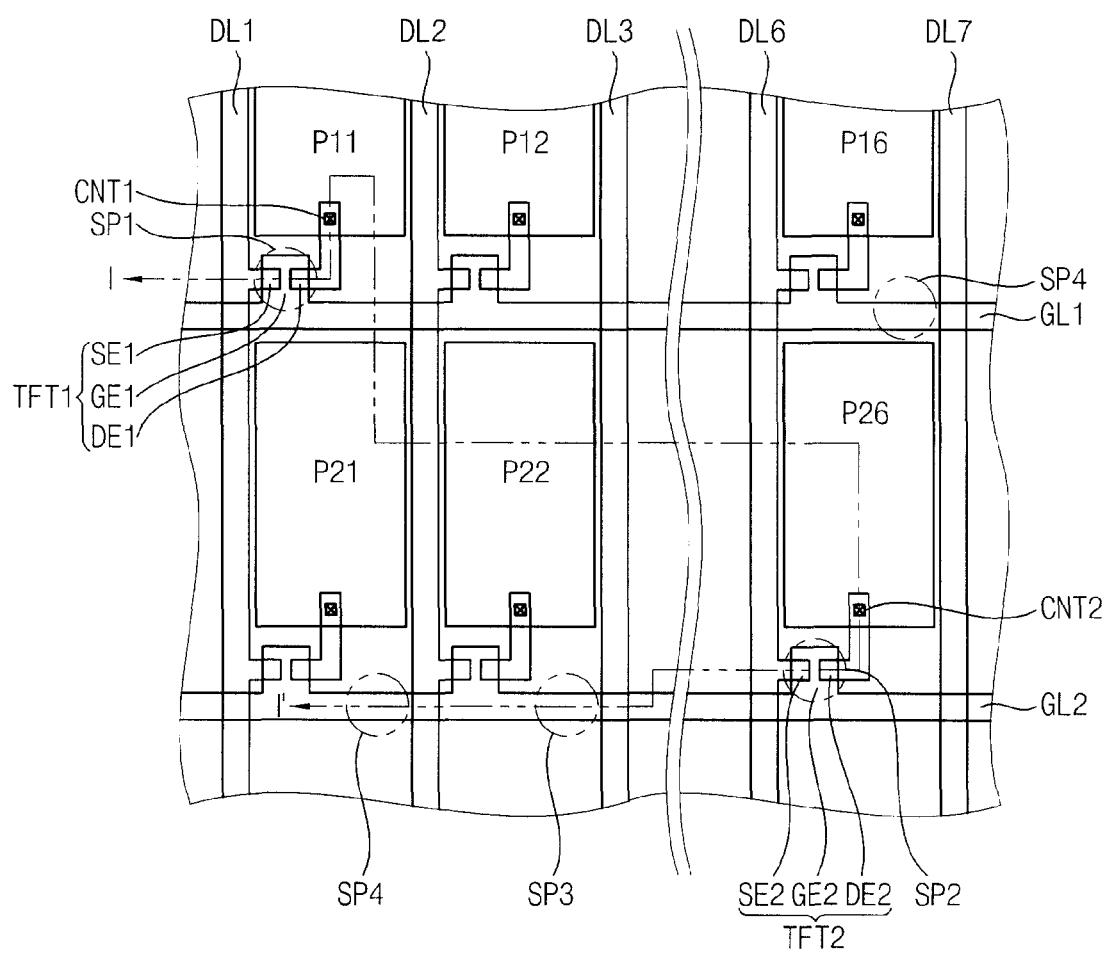
FIG. 2 is an enlarged plan view partially illustrating the display apparatus of FIG. 1.
Figure 3:
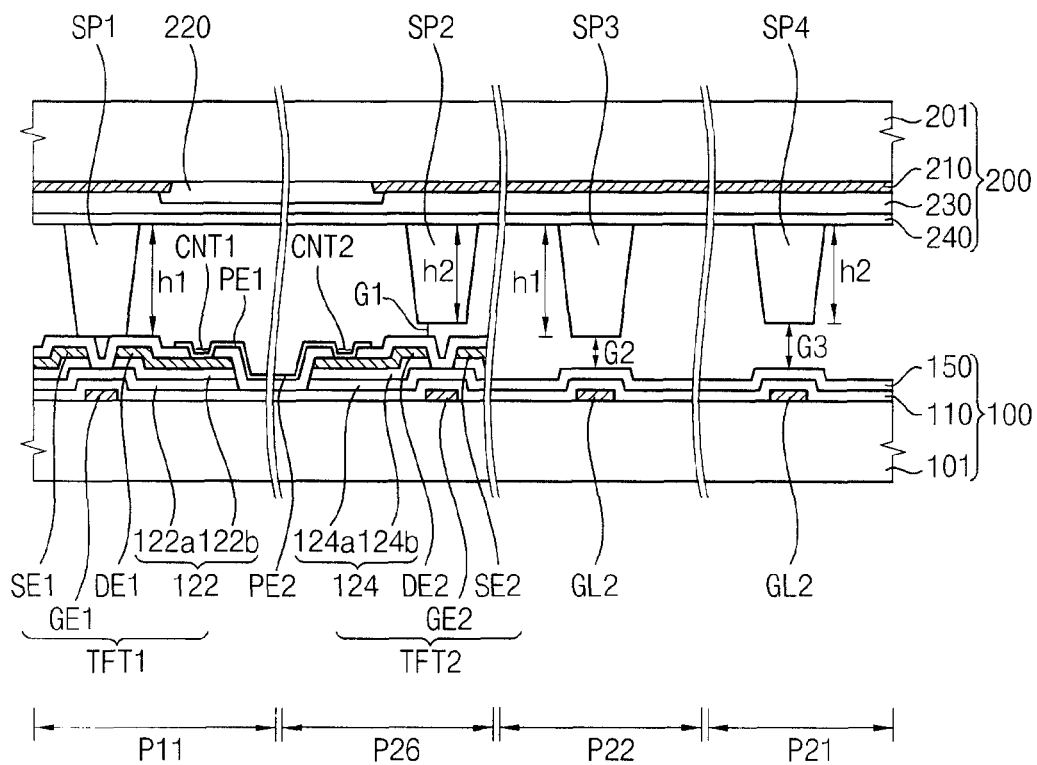
FIG. 3 is a cross-sectional view of the display apparatus taken along a line I-I' of FIG. 2.

FIG. 2 is an enlarged plan view partially illustrating the display apparatus of FIG. 1. FIG. 3 is a cross-sectional view of the display apparatus taken along a line I-I' of FIG. 2.

Referring to FIG. 1, FIG. 2, and FIG. 3, the display apparatus includes a display substrate 100, a counter substrate 200 facing the display substrate 100, and a liquid crystal layer 300 disposed between the display substrate 100 and the counter substrate 200.

The display substrate 100 may include a plurality of gate lines GL1 to GLn, a plurality of data lines DL1 to DLm, a first switching element TFT1, a second switching element TFT2, a first pixel electrode PE1, and a second pixel electrode PE2 that are formed on a first base substrate 101. Here, n and m are natural numbers.

Hereinafter, an area corresponding to a first row and a first column is referred to as a first pixel area P11, and an area corresponding to a second row and a sixth column is referred to as a second pixel area P26. In addition, an area corresponding to a second row and a second column is referred to as a third pixel area P22, and an area corresponding to a second row and a first column is referred to as a fourth pixel area P21.

The first switching element TFT1 is formed in the first pixel area P11. The first switching element TFT1 includes a first gate electrode GE1, a first semiconductor pattern 122, a first source electrode SE1 and a first drain electrode DE1. The first gate electrode GE1 is electrically connected to a first gate line GL1. The first semiconductor pattern 122 overlaps the first gate electrode GE1, and a gate insulating layer 110 is disposed between the first semiconductor pattern 122 and the first gate electrode GE1. The first semiconductor pattern 122 may include a first semiconductor layer 122a including an amorphous silicon and a first ohmic contact layer 122b including an amorphous silicon doped with N type dopants of a high concentration. The first source electrode SE1 is formed on the first semiconductor pattern 122 and makes contact with the first ohmic contact layer 122b. The first drain electrode DE1 is spaced apart from the first source electrode SE1 and is disposed on the first semiconductor pattern 122. An area where the first source electrode SE1 and the first drain electrode DE1 are spaced apart from each other is defined as a channel portion of the first switching element TFT1.

The second switching element TFT2 is formed in the second pixel area P26. The second switching element TFT2 includes a second gate electrode GE2, a second semiconductor pattern 124, a second source electrode SE2 and a second drain electrode DE2. The second gate electrode GE2 is electrically connected to a second gate line GL2. The second semiconductor pattern 124 overlaps the second gate electrode GE2, and a gate insulating layer 110 is disposed is between the second semiconductor pattern 124 and the second gate electrode GE2. The second semiconductor pattern 124 may include a second semiconductor layer 124a including an amorphous silicon and a second ohmic contact layer 124b including an amorphous silicon doped with N type dopants of a high concentration. The second source electrode SE2 is formed on the second semiconductor pattern 124 and makes contact with the second ohmic contact layer 124b. The second drain electrode DE2 is spaced apart from the second source electrode SE2 and disposed on the second semiconductor pattern 124. An area where the second source electrode SE2 and the second drain electrode DE2 are spaced apart from each other is defined as a channel portion of the second switching element TFT2.

The display substrate 100 may further include a protective insulating layer 150.

The protective insulating layer 150 is formed to cover the first source electrode SE1, the second source electrode SE2, the first drain electrode DE1 and the second drain electrode DE2. The protective insulating layer 150 includes a first contact hole CNT1 exposing the first drain electrode DE1 and a second contact hole CNT2 exposing the second drain electrode DE2.

The first pixel electrode PE1 may be formed in the first pixel area P11 and may include a transparent conductive material. The first pixel electrode PE1 is electrically connected to the first drain electrode DE1 of the first switching element TFT1 through the first contact hole CNT1 formed through the protective insulating layer 150.

The second pixel electrode PE2 is formed in the second pixel area P26 and is electrically connected to the second drain electrode DE2 of the second switching element TFT2 through the second contact hole CNT2 formed through the protective insulating layer 150.

The counter substrate 200 may include a blocking pattern 210, a color filter layer 220, an overcoating layer 230, a common electrode 240, the first spacer SP1, the second spacer SP2, the third spacer SP3, and the fourth spacer SP4 that are formed on a second base substrate 201 facing the first base substrate 101.

The blocking pattern 210 is formed in boundary areas between pixel areas defined on the second base substrate 201, and prevents light leakage.

The color filter layer 220 is disposed in the pixel areas. The color filter layer 220 may include a red color filter, a green color filter, and a blue color filter.

The overcoating layer 230 is formed on the second base substrate 201 on which the color filter layer 220 is formed.

The common electrode 240 includes a transparent conductive material, and is formed on the second base substrate 201 on which the overcoating layer 230 is formed.

The first spacer SP1, second spacer SP2, third spacer SP3, and fourth spacer SP4 are formed on the second base substrate 201 on which the common electrode 240 is formed.

The first spacer SP1 has a first height h1. The first spacer SP1 is formed over a channel portion of the first switching element TFT1 formed in the first pixel area P11 of the first base substrate 101 to make contact with the display substrate 100. The first spacer SP1 maintains a cell gap between the first base substrate 101 and the second base substrate 201.

The second spacer SP2 is formed over a channel portion of the second switching element TFT2 formed in the second pixel area P26 of the first base substrate 101. The second spacer SP2 may have a second height h2 less than the first height h1. The second spacer SP2 is spaced apart from the display substrate 100 by a first gap G1 corresponding to a difference x between the first height h1 and the second height h2. For example, the difference x between the first height h1 and the second height h2 may be $0 < x \leq 0.3$ μm. The second spacer SP2 is maintains a cell gap between the first base substrate 101 and the second base substrate 201 with the first spacer SP1. The second spacer SP2 is shorter than the first spacer SP1 so that a margin of the dropping process may be enhanced.

The third spacer SP3 is formed over the second gate line GL2 formed in the third pixel area P22 of the first base substrate 101. The third spacer SP3 may have a first height h1 substantially the same as the height of the first spacer SP1. The third spacer SP3 is spaced apart from the first base substrate 101 by a second gap G2 larger than the first gap G1. For example, the second gap G2 may be about 0.5 μm and may be equal to a sum of a thickness of the first semiconductor pattern 122 and a thickness of the first source electrode SE1 or the first drain electrode DE1. For example, the thickness of the first semiconductor pattern 122 may be about 2000 Å, and the thickness of the first source electrode SE1 or the first drain electrode DE1 may be about 3000 Å. In this case, the second gap G2 may be about 5000 Å.

The fourth spacer SP4 is formed on the second gate line GL2 disposed in the fourth pixel area P21 of the first base substrate 101. The fourth spacer SP4 may have a second height h2 substantially the same as the height of the second spacer SP2. The fourth spacer SP4 may be spaced apart from the first base substrate 101 by a third gap G3 larger than the second gap G2. For example, the third gap G3 may be equal to a sum of a difference x between the first height h1 and the second height h2, a thickness of the first semiconductor pattern 122 and a thickness of the first source electrode SE1 or the first drain electrode DE1. If the difference x between the first height h1 and the second height h2 is about 0.2 μm and the sum of the thickness of the first semiconductor pattern 122 and the thickness of the first source electrode SE1 or the first drain electrode DE1 is about 5000 Å, the third gap G3 may be about 7000 Å.

Figure 4:
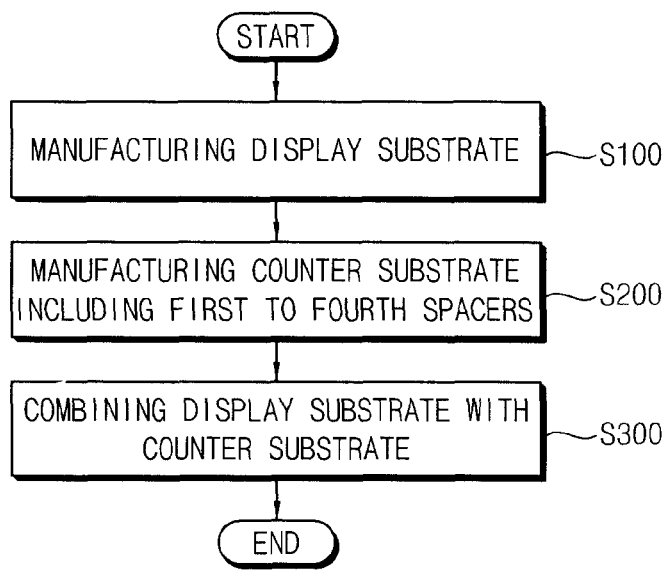
FIG. 4 is a flow chart illustrating a method for manufacturing the display apparatus of FIG. 3.

FIG. 4 is a flow chart illustrating a method for manufacturing the display is apparatus of FIG. 3.

Referring to FIG. 3 and FIG. 4, the display substrate 100 including the first pixel electrode PE1 and second pixel electrode PE2 is manufactured (step S100).

The counter substrate 200 including the common electrode 240 and the first spacer SP1, second spacer SP2, third spacer SP3, and fourth spacer SP4 formed on the common electrode 240 is manufactured (step S200). A detailed method for manufacturing the display substrate 100 and the counter substrate 200 is described below.

The display substrate 100 is combined with the counter substrate 200 using a sealing member (not shown) (step S300). In this case, the first spacer SP1 makes contact with the display substrate 100, the second spacer SP2 is spaced apart from the display substrate 100 by the first gap G1, the third spacer SP3 is spaced apart from the display substrate 100 by the second gap G2, and the fourth spacer SP4 is spaced apart from the display substrate 100 by the third gap G3.

Figure 5A:
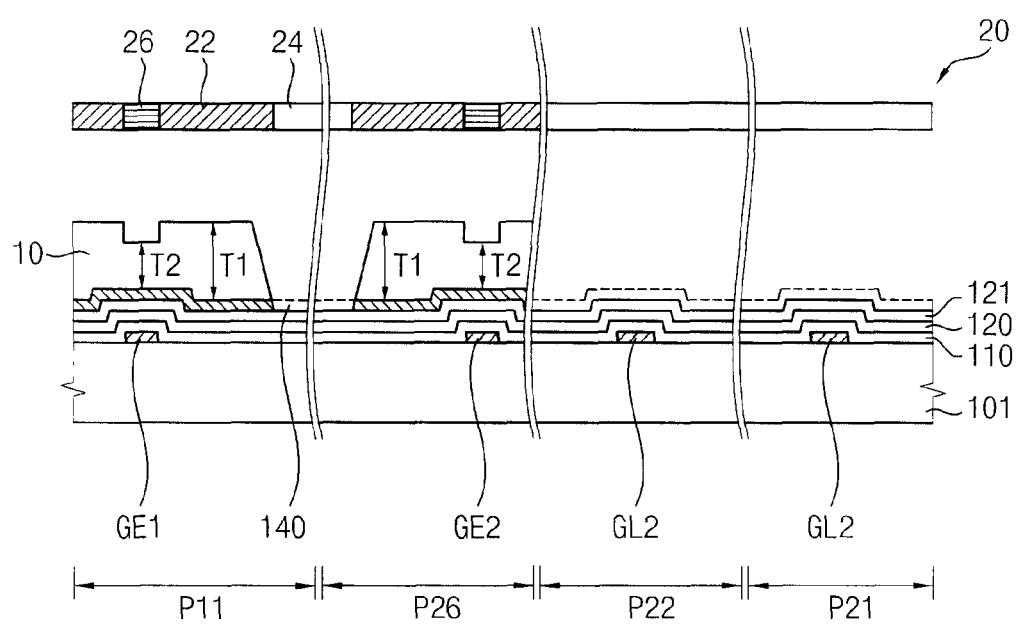
FIG. 5A, FIG. 5B, and FIG. 5C are cross-sectional views illustrating a method for manufacturing the display substrate of FIG. 3.
Figure 5B:
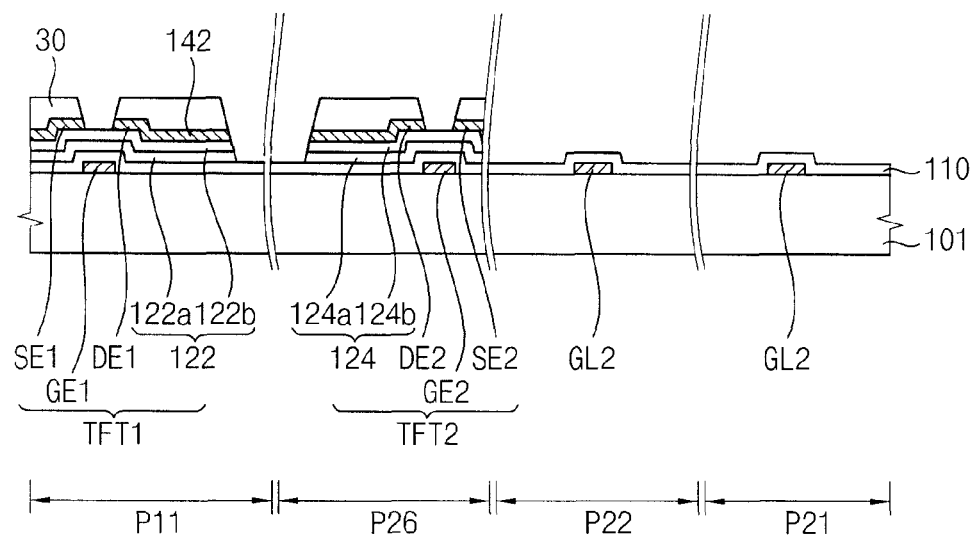
Figure 5C:
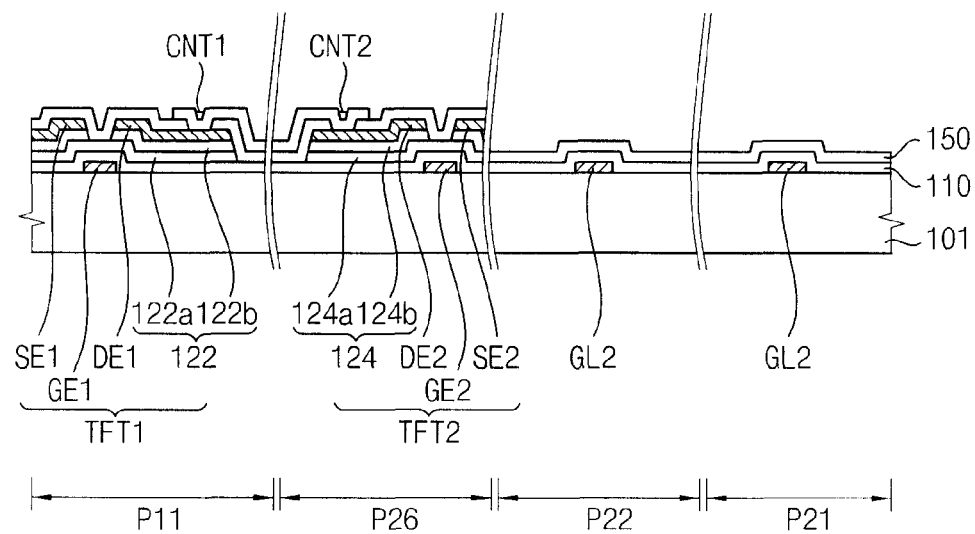

FIG. 5A, FIG. 5B, and FIG. 5C are cross-sectional views illustrating a method for manufacturing the display substrate of FIG. 3.

Referring to FIG. 3 and FIG. 5A, a gate metal layer is formed on the first base substrate 101 and the gate metal layer is patterned to form a gate pattern including the first gate electrode GE1, the second gate electrode GE2 and the second gate line GL2. The gate insulating layer 110, the semiconductor layer 120, the ohmic contact layer 121 and a source metal layer 140 are sequentially formed on the first base substrate 101 including the gate pattern. For example, the gate insulating layer 110 may include a silicon nitride or a silicon oxide, the semiconductor layer 120 may include an amorphous silicon, and the ohmic contact layer 121 may include an amorphous silicon doped with N type dopants of a high concentration.

A first photo pattern 10 is formed on the first base substrate 101 on which the source metal layer 140 is formed. After forming a photoresist layer including a light-sensitive material on the first base substrate 101 on which the source metal layer 140 is formed, a first mask 20 is disposed over the first base substrate 101 including the photoresist layer, light is irradiated to the first mask 20, which is then developed to form the first photo pattern 10. For example, the photoresist layer may be a positive type photoresist that a portion of the photoresist irradiated by the light is removed by a developer and a portion of the photoresist blocking the light is cured, so that the photoresist layer remains on the first base substrate 101. In this case, the first mask 20 may include a blocking portion 22, a transmissive portion 24 and a transflective portion 26. The blocking portion 22 is disposed over the first source electrode SE1, second source electrode SE2, first drain electrode DE1, and second drain electrode DE2. The transflective portion 26 is disposed over the channel portion of the first switching element TFT1 and channel portion of the second switching element TFT2. The first photo pattern 10 disposed over the first source electrode SE1, second source electrode SE2, first drain electrode DE1, and second drain electrode DE2 has a first thickness T1, and the first photo pattern 10 disposed over the channel portion of the first switching element TFT1 and the channel portion of the second switching element TFT2 has a second thickness T2 thinner than the first thickness T1.

The source metal layer 140 is primarily etched using the first photo pattern 10 as an etching protection layer. Hereinafter, a process that the source metal layer 140 is primarily etched is defined as a first metal etching process. A metal pattern 142 (depicted in FIG. 5B) is formed on the first base substrate 101 via the first metal etching process. The first ohmic contact layer 122b, second ohmic contact layer 124b, first semiconductor layer 122a, and second semiconductor layer 124a are etched using the metal pattern 142 as an etching protection layer. The first ohmic contact layer 122b, second ohmic contact layer 124b, first semiconductor layer 122a, and second semiconductor layer 124a remain under the data lines DL1 to DLm and the metal pattern 142. The gate insulating layer 110 is exposed in an area not including the metal pattern 142.

Referring to FIG. 5B, the first photo pattern 10 is partially removed to expose the metal pattern 142 in an area where the channel portion of the first switching element TFT1 and channel portion of the second switching element TFT2 are formed. The first photo pattern 10 is removed by a determined thickness to form a remaining pattern 30. The thickness of the first photo pattern 10 may be the first thickness T1. The remaining pattern 30 has a third thickness T3 thinner than the first thickness T1. The third thickness may be substantially the same as the difference between the second thickness T2 and the first thickness T1.

The remaining pattern 30 may disposed in an area where the first source electrode SE1 and second source electrode SE2 are formed and an area where the first drain electrode DE1 and second drain electrode DE2 are formed.

The metal pattern 142 is secondarily etched using the remaining pattern 30 as an etching protection layer. Hereinafter, a process that the metal pattern 142 is secondarily etched is defined as a second metal etching process. The metal pattern 142 in an area where the channel portion is formed is removed via the second metal etching process. Accordingly, the first source electrode SE1, second source electrode SE2, first drain electrode DE1 and second drain electrode DE2 are formed.

Portions of the first ohmic contact layer 122b and second ohmic contact layer 124b are then removed using the first source electrode SE1, second source electrode SE2, first drain electrode DE1, second drain electrode DE2, and the remaining pattern 30 as an etching is protection layer to expose the first semiconductor layer 122a over the channel portion of the first switching element TFT1 and the second semiconductor layer 124a over the channel portion of the second switching element TFT2.

The remaining pattern 30 may be removed using a stripper. Accordingly, as shown in FIG. 5C, the first switching element TFT1 including the first gate electrode GE1, the first source electrode SE1, the first drain electrode DE1 and the first semiconductor pattern 122, and the second switching element TFT2 including the second gate electrode GE2, the second source electrode SE2 and the second semiconductor pattern 124 are formed.

After forming the protective insulating layer 150 on the first base substrate 101 on which the first switching element TFT1 and second switching element TFT2 are formed, the protective insulating layer is patterned to form a first contact hole CNT1 exposing the first drain electrode DE1 and a second contact hole CNT2 exposing the second drain electrode DE2.

The first pixel electrode PE1 electrically connected to the first drain electrode DE1 through the first contact hole CNT1 and the second pixel electrode PE2 electrically connected to the second drain electrode DE2 through the second contact hole CNT2 are formed on the first base substrate 101 on which the protective insulating layer 150 is formed.

Figure 6A:
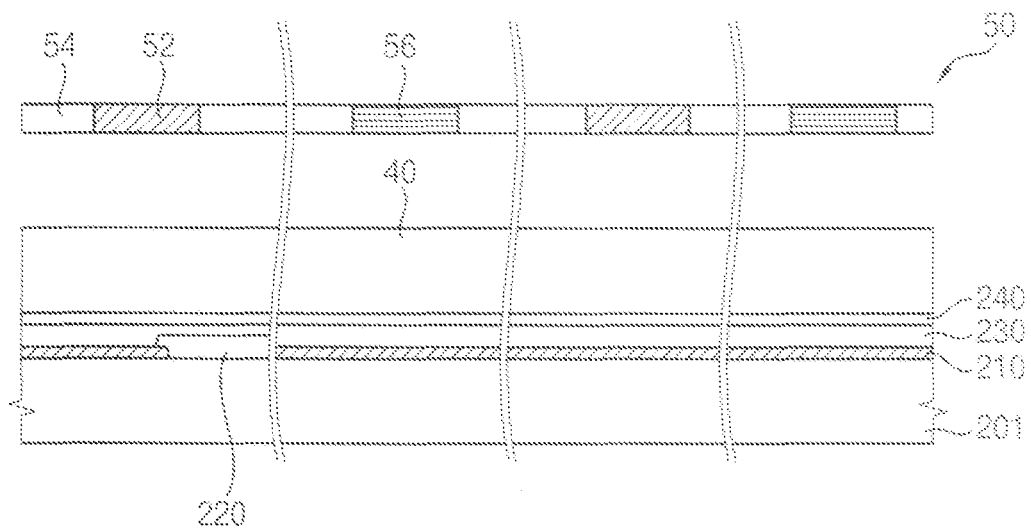
FIG. 6A and FIG. 6B are cross-sectional views illustrating a method for manufacturing the counter substrate of FIG. 3.
Figure 6B:
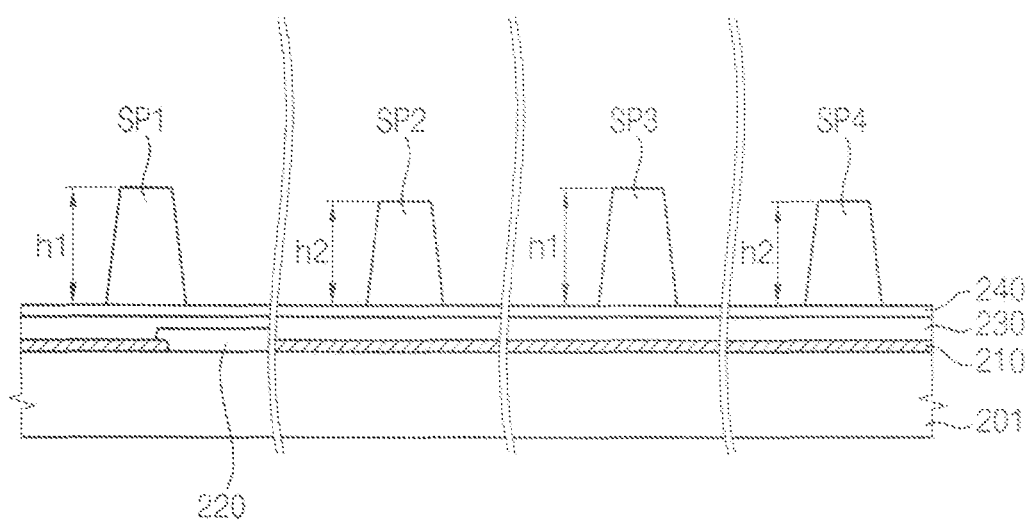

FIG. 6A and FIG. 6B are cross-sectional views illustrating a method for manufacturing a counter substrate of FIG. 3.

Referring to FIG. 3 and FIG. 6A, the blocking pattern 210, the color filter layer 220, the overcoating layer 230 and the common electrode 240 are sequentially formed on the second base substrate 201.

A photoresist layer 40 is formed on the second base substrate 201 on which the common electrode 240 is formed. A second mask 50 is disposed over the second base substrate 201 including the photoresist layer 40. For example, the photoresist layer 40 may be a positive type photoresist layer such that a portion of the photoresist layer irradiated by light is removed by a developer and a portion of the photoresist not irradiated by light is cured and remains on the second base substrate 201. The second mask 50 may include a blocking portion 52, a transmissive portion 54 and a transflective portion 56. The blocking portion 52 is disposed over the first spacer SP1 and third spacer SP3. The transflective portion 56 is disposed over the second spacer SP2 and fourth spacer SP4. The transmissive portion 54 is disposed over an area not including the first spacer SP1, second spacer SP2, third spacer SP3, and fourth spacer SP4.

After irradiating light to the photoresist layer 40 at the second mask 50, the photoresist layer 40 is developed by a developer. Accordingly, as shown in FIG. 6B, the photoresist layer 40 remains on the common electrode 240 to form the first spacer SP1, second spacer SP2, third spacer SP3, and fourth spacer SP4. The first spacer SP1 and second spacer SP2 have a first height h1, and the third spacer SP3 and fourth spacer SP4 have a second height h2 less than the first height h1.

According to an exemplary embodiment, a margin in a liquid crystal injection process is sufficiently guaranteed through the first spacer SP1 and second spacer SP2, and an external pressure is effectively distributed through the third spacer SP3 and fourth spacer SP4, so that the margin in the liquid crystal injection process may be enhanced and defects due to the external pressure may be prevented at the same time.

Figure 7:
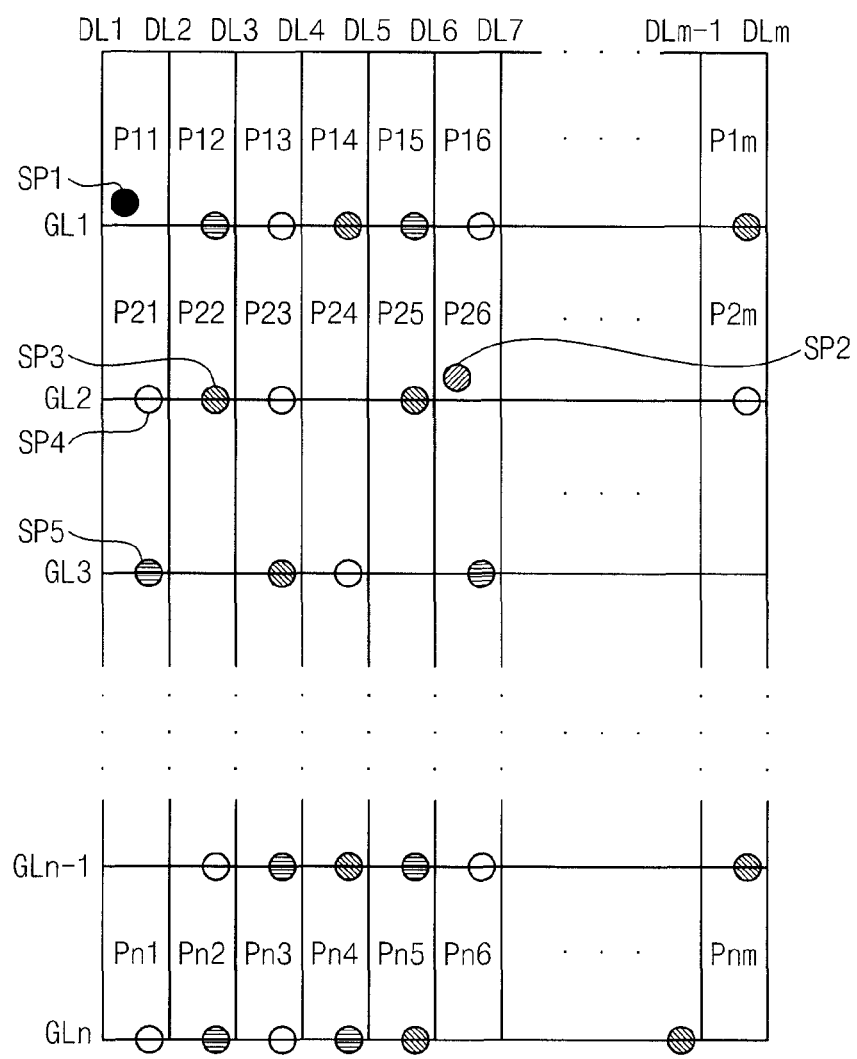
FIG. 7 is a plan view illustrating a display apparatus according to an exemplary embodiment of the present invention.
Figure 8:
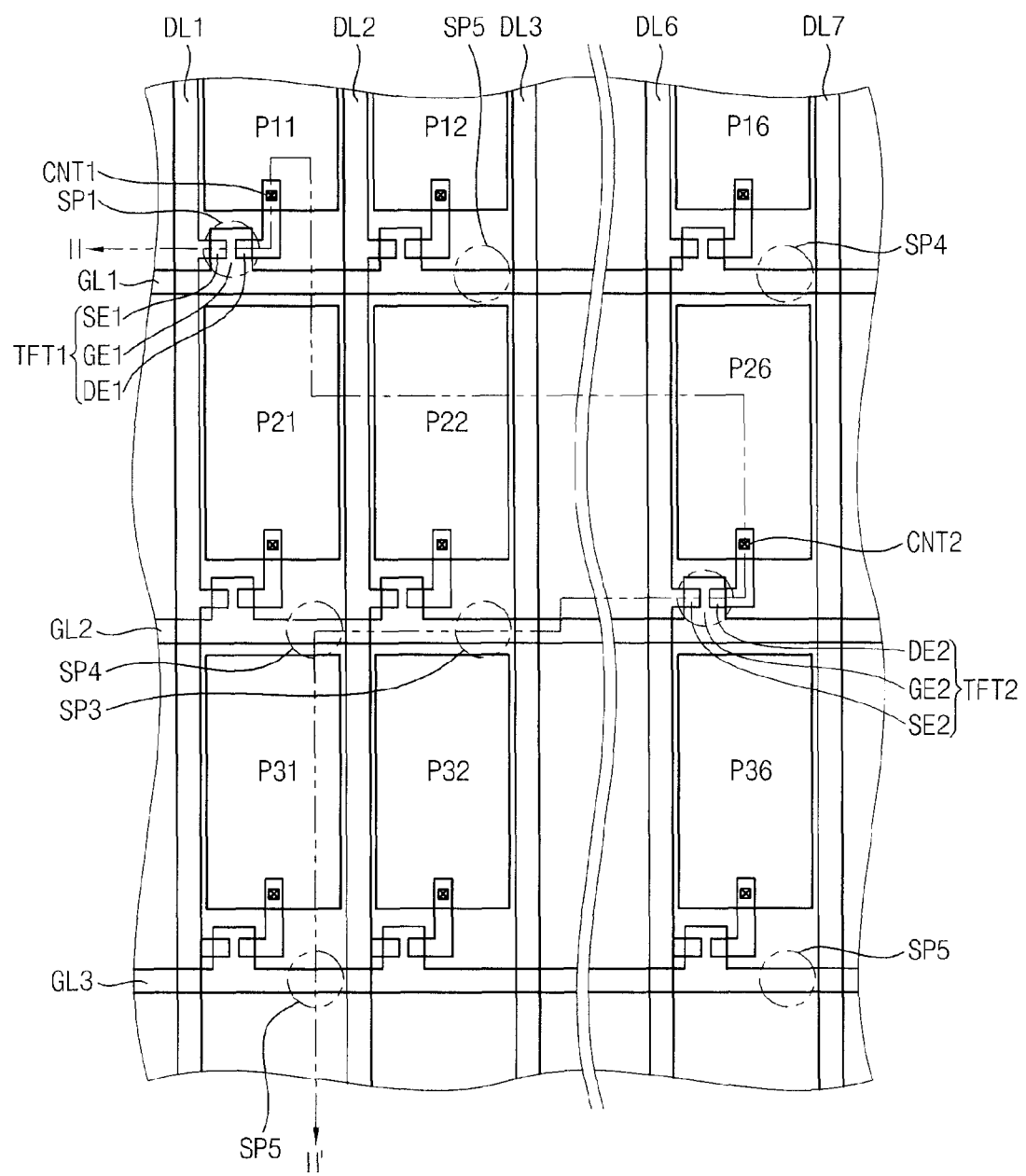
FIG. 8 is an enlarged plan view partially illustrating the display apparatus of FIG. 7.
Figure 9:
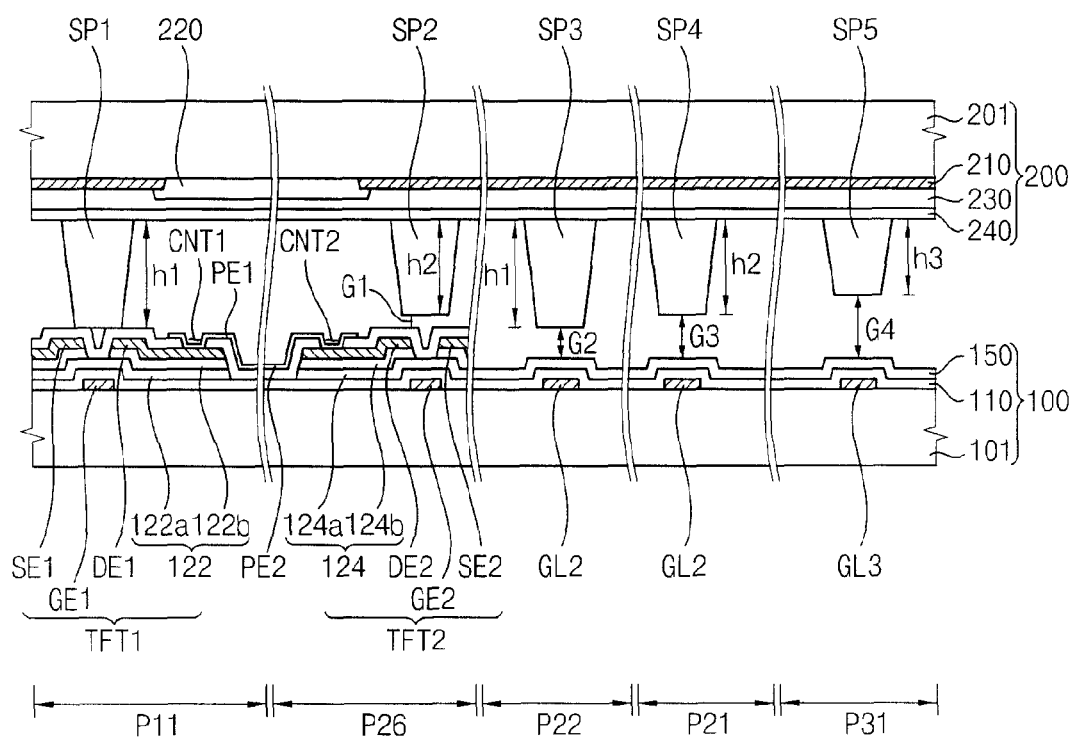
FIG. 9 is a cross-sectional view of the display apparatus taken along a line II-IF of FIG. 8.

FIG. 7 is a plan view illustrating a display apparatus according to an exemplary embodiment of the present invention. FIG. 8 is an enlarged plan view partially illustrating the display apparatus of FIG. 7. FIG. 9 is a cross-sectional view of the display apparatus taken along a line II-II' of FIG. 8.

Referring to FIG. 7, FIG. 8, and FIG. 9, a display apparatus according to an exemplary embodiment includes a display substrate 100, a counter substrate 200 facing the display substrate 100 and a liquid crystal layer 300 disposed between the display substrate 100 and the counter substrate 200.

The display apparatus according to an exemplary embodiment is substantially the same as the display apparatus described above with reference to FIG. 1, FIG. 2, FIG. 3, FIG. 4, FIG. 5A, FIG. 5B, FIG. 5C, FIG. 6A, and FIG. 6B except that the counter substrate 200 further includes a fifth spacer SP5, so the same reference numerals will be used to refer to the same or like parts and thus repetitive explanation will be omitted or briefly included.

The first spacer SP1 may have a first height h1 and the second spacer SP2 may have a second height h2 less than the first height h1. The first spacer SP1 maintains a cell gap between the display substrate 100 and the counter substrate 200. The second spacer SP2 is spaced apart from the display substrate 100 by a first gap G1, which corresponds to a difference x between the first height h1 and the second height h2.

The third spacer SP3 may have a first height h1 substantially the same as the height of the first spacer SP1. The third spacer SP3 is spaced apart from the display substrate 100 by a second gap G2 larger than the first gap G1. The fourth spacer SP4 may have a second height h2 substantially the same as the height of the second spacer SP2. The fourth spacer SP4 may be spaced apart from the display substrate 100 by a third gap G3 larger than the second gap G2.

The fifth spacer SP5 is formed on the common electrode 240 disposed on the counter substrate 200. The fifth spacer SP5 is formed over a third gate line GL3 formed in a fifth pixel area P31 corresponding to a third row and a first column. The fifth spacer SP5 may have a is third height h3 less than the second height h2. The fifth spacer SP5 may be spaced apart from the display substrate 100 by a fourth gap G4 larger than the third gap G3. For example, the fourth gap G4 may be equal to a sum of a difference x between the first height h1 and the third height h3, a thickness of the first semiconductor pattern 122 of the first switching element TFT1 and a thickness of the first source electrode SE1 or the first drain electrode DE1.

Above, a five-spacer structure including the first spacer SP1, second spacer SP2, third spacer SP3, fourth spacer SP4, and fifth spacer SP5 is explained, but the present invention is not limited thereto. For example, although not shown in the figure, a spacer having a gap of magnitude between the first gap G1 and the fourth gap G4 or larger than the fourth gap G4 may be further included.

A method for manufacturing the display apparatus according to an exemplary embodiment is substantially the same as the method described above with reference to FIG. 1, FIG. 2, FIG. 3, FIG. 4, FIG. 5A, FIG. 5B, FIG. 5C, FIG. 6A, and FIG. 6B except that a light-transmitting efficiency of the transflective portion disposed corresponding to a fifth spacer SP5 is higher than that of the transflective portion disposed corresponding to the second spacer SP2 and fourth spacer SP4. Accordingly, a height of the fifth spacer SP5 is less than heights of the second spacer SP2 and fourth spacer SP4.

Figure 10:
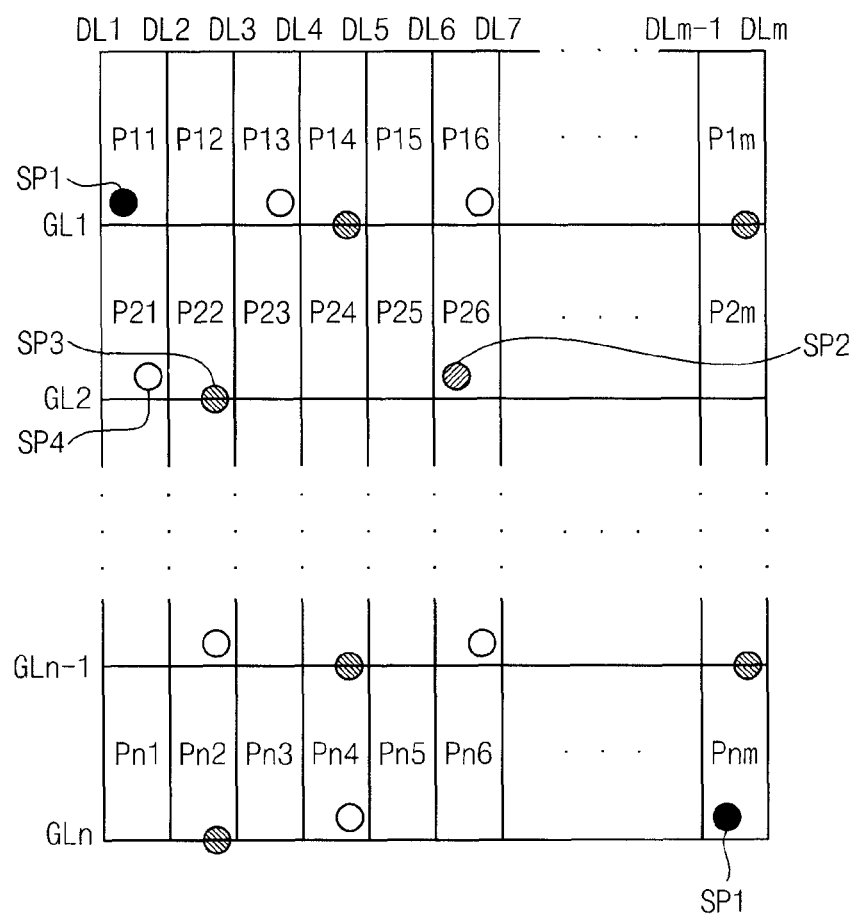
FIG. 10 is a plan view illustrating a display apparatus according to an exemplary embodiment of the present invention.
Figure 11:
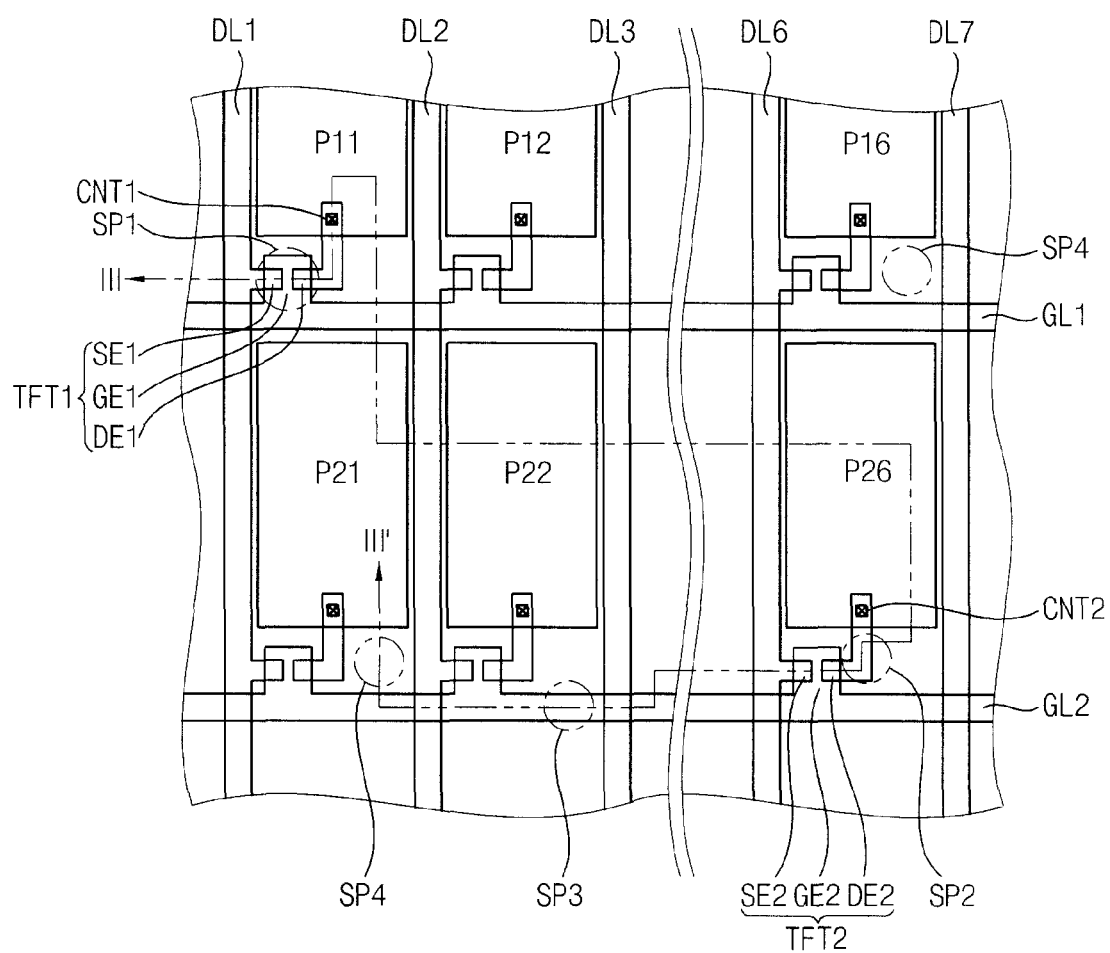
FIG. 11 is an enlarged plan view partially illustrating the display apparatus of FIG. 10.
Figure 12:
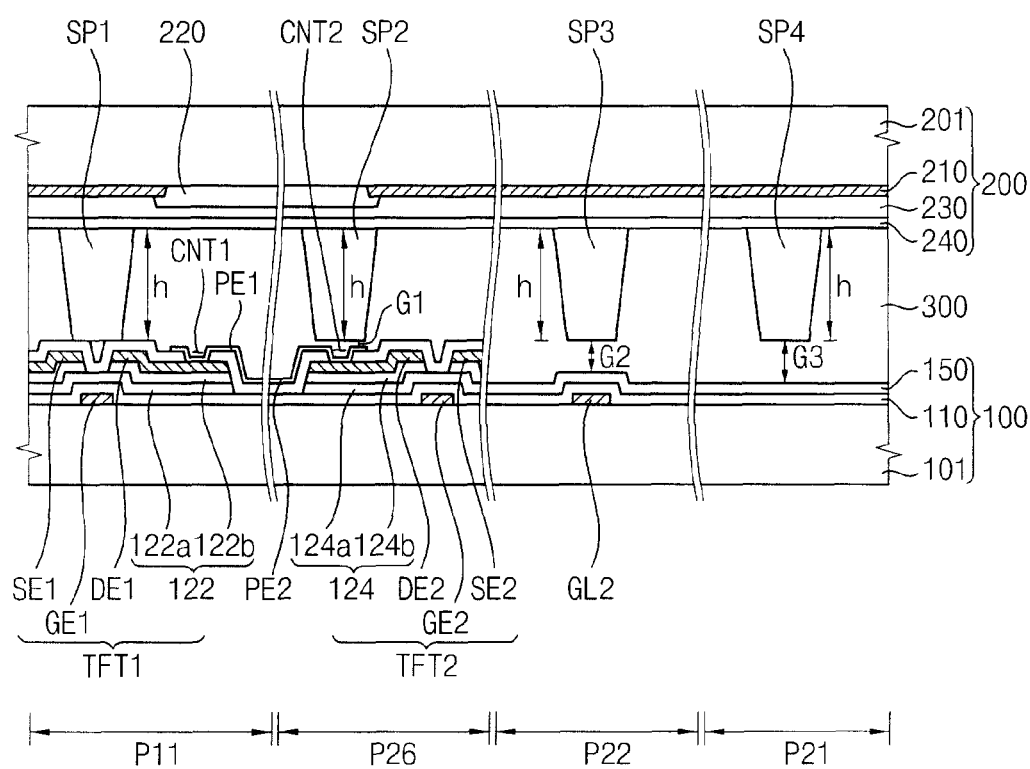
FIG. 12 is a cross-sectional view of the display apparatus taken along a line III-III' of FIG. 11.

FIG. 10 is a plan view illustrating a display apparatus according to an exemplary embodiment of the present invention. FIG. 11 is an enlarged plan view partially illustrating the display apparatus of FIG. 10. FIG. 12 is a cross-sectional view of a display apparatus taken along a line III-III' of FIG. 11.

Referring to FIG. 10, FIG. 11, and FIG. 12, a display apparatus according an exemplary embodiment includes a display substrate 100, a counter substrate 200 facing the is display substrate 100 and a liquid crystal layer 300 disposed between the display substrate 100 and the counter substrate 200.

The display substrate 100 according to an exemplary embodiment may include a plurality of gate lines GL1 to GLn, a plurality of data lines DL1 to DLm, a first switching element TFT1, a second switching element TFT2, a first pixel electrode PE1 and a second pixel electrode PE2 which are formed on a first base substrate 101. A plurality of pixel areas P11 to Pnm is defined by the gate lines GL1 to GLn and the data lines DL1 to DLm. The pixel areas P11 to Pnm are arranged in a 2-dimensional array along a plurality of rows and a plurality of columns.

A display substrate 100 according to an exemplary embodiment is substantially the same as the display substrate 100 described with reference to FIG. 1, FIG. 2, FIG. 3, FIG. 4, FIG. 5A, FIG. 5B, FIG. 5C, FIG. 6A, and FIG. 6B, thus the same reference numerals will be used to refer to the same or like parts and thus repetitive explanation will be omitted or briefly included.

The counter substrate 200 may include a blocking pattern 210, a color filter layer 220, an overcoating layer 230, a common electrode 240, the first spacer SP1, the second spacer SP2, the third spacer SP3, and the fourth spacer SP4, formed on a second base substrate 201 facing the first base substrate 101.

The blocking pattern 210 is formed in boundary areas between pixel areas defined on the second base substrate 201, and prevents light leakage.

The color filter layer 220 is disposed in the pixel areas. The color filter layer 220 may include a red color filter, a green color filter, and a blue color filter.

The overcoating layer 230 is formed on the second base substrate 201 on which is the color filter layer 220 is formed.

The common electrode 240 includes a transparent conductive material, and is formed on the second base substrate 201 on which the overcoating layer 230 is formed.

The first spacer SP1, second spacer SP2, third spacer SP3, and fourth spacer SP4 are formed on the second base substrate 201 on which the common electrode 240 is formed. The first spacer SP1, second spacer SP2, third spacer SP3, and fourth spacer SP4 are disposed in areas different from each other. The first spacer SP1, second spacer SP2, third spacer SP3, and fourth spacer SP4 are substantially the same height h.

The first spacer SP1 is formed over a channel portion of the first switching element TFT1 formed in the first pixel area P11 of the display substrate 100, and makes contact with the display substrate 100. The first spacer SP1 maintains a cell gap between the display substrate 100 and the counter substrate 200.

The second spacer SP2 maintains a cell gap between the display substrate 100 and the counter substrate 200 with the first spacer SP1. The second spacer SP2 is formed over a second drain electrode DE2 of the second switching element TFT2 formed in the second pixel area P26 of the counter substrate 200. The second spacer SP2 is spaced apart from the first base substrate 101 by a first gap G1. The first gap G1 may be about 2000 Å corresponding to a thickness of the first gate electrode GE1, so that a margin in a liquid crystal injection process may be enhanced.

The third spacer SP3 is formed over a protective insulating layer 150 formed on the second gate line GL2 formed in the third pixel area P22 of the display substrate 100. The third spacer SP3 is spaced apart from the display substrate 100 by a second gap G2 larger than the first gap G1. For example, the second gap G2 may be equal to a sum of a thickness of the is first semiconductor pattern 122 and a thickness of the first source electrode SE1 or the first drain electrode DE1. The thickness of the first semiconductor pattern 122 may be about 2000 Å, and the thickness of the first source electrode SE1 or the first drain electrode DE1 may be about 3000 Å. In this case, the second gap G2 may be about 5000 Å.

The fourth spacer SP4 is formed over the protective insulating layer 150 formed on a gate insulating layer 110 in the fourth pixel area P21. The fourth spacer SP4 may be spaced apart from the display substrate 100 by a third gap G3 larger than the second gap G2. For example, the third gap G3 may be equal to a sum of a thickness of the first gate electrode GE1, a thickness of the first semiconductor pattern 122 and a thickness of the first source electrode SE1 or the first drain electrode DE1. For example, the thickness of each of the gate electrode GE1 and the first semiconductor pattern 122 of the first switching element TFT1 may be about 2000 Å and the thickness of the first source electrode SE1 or the first drain electrode DE1 may be about 3000 Å. In this case, the third gap G3 may be about 7000 Å.

The first spacer SP1, second spacer SP2, third spacer SP3, and fourth spacer SP4 are substantially the same height h, but the first spacer SP1, second spacer SP2, third spacer SP3, and fourth spacer SP4 have corresponding gaps different from each other according to the height of a surface of the display substrate 100 facing the first spacer SP1, second spacer SP2, third spacer SP3, and fourth spacer SP4.

A method for manufacturing a display apparatus according to an exemplary embodiment is substantially the same as described above with reference to FIG. 1, FIG. 2, FIG. 3, FIG. 4, FIG. 5A, FIG. 5B, FIG. 5C, FIG. 6A, and FIG. 6B except for a method for manufacturing the counter substrate 200, thus repetitive explanation concerning the above elements will be omitted.

Figure 13A:
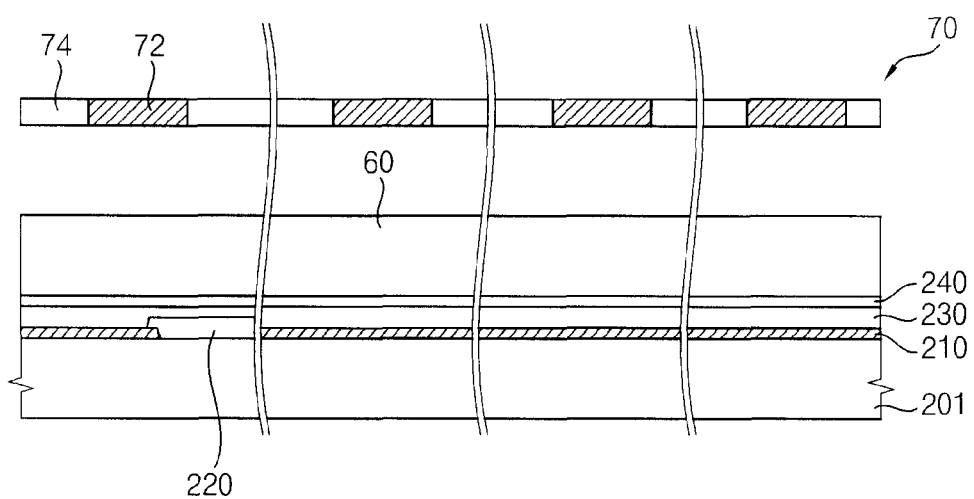
FIG. 13A and FIG. 13B are cross-sectional views illustrating a method for manufacturing a counter substrate of FIG. 12.
Figure 13B:
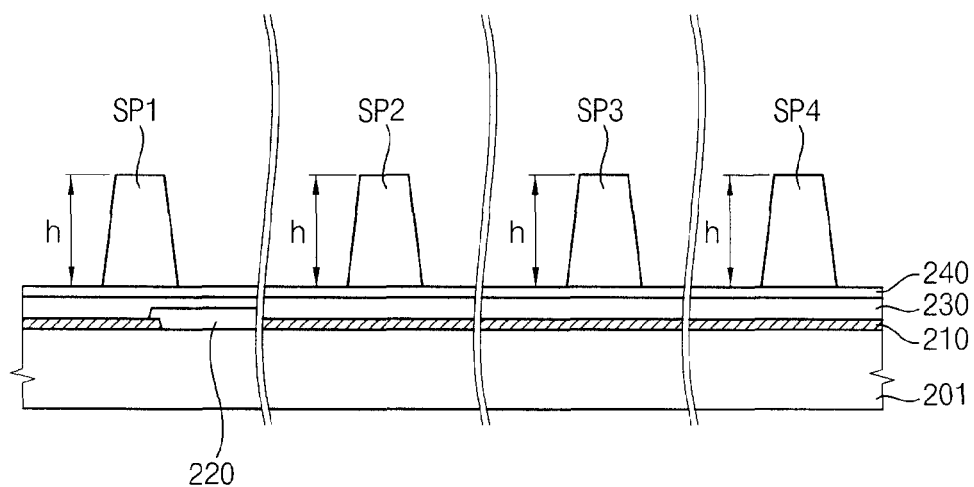

FIG. 13A and FIG. 13B are cross-sectional views illustrating a method for manufacturing the counter substrate 200 of FIG. 12.

Referring to FIG. 12 and FIG. 13A, the blocking pattern 210, the color filter layer 220, the overcoating layer 230, and the common electrode 240 are sequentially formed on the second base substrate 201.

A photoresist layer 60 is formed on the second base substrate 201 on which the common electrode 240 is formed. A third mask 70 is disposed over the counter substrate 200 including the photoresist layer 60. For example, the photoresist layer 60 may be a positive type photoresist layer such that a portion of the photoresist layer irradiated by light is removed by a developer and a portion of the photoresist not irradiated by light is cured and remains on the second base substrate 201. The third mask 60 may include a blocking portion 72 and a transmissive portion 74. The blocking portion 72 is disposed over the first spacer SP1, second spacer SP2, third spacer SP3, and fourth spacer SP4 and the transmissive portion 74 is disposed over an area not including the first spacer SP1, second spacer SP2, third spacer SP3, and fourth spacer SP4.

After irradiating light to the photoresist layer 60 at the third mask 70, the photoresist layer 60 is developed by a developer. Accordingly, as shown in FIG. 13B, portions of the photoresist layer 60 remain on the common electrode 240 to form the first spacer SP1, second spacer SP2, third spacer SP3, and fourth spacer SP4. The first spacer SP1, second spacer SP2, third spacer SP3, and fourth spacer SP4 are substantially the same height h.

In an exemplary embodiment a four spacer structure including the first spacer SP1, second spacer SP2, third spacer SP3, and fourth spacer SP4 is explained, but the present invention is not limited thereto. For example, although not shown in the figure, one or more is spacers having a gap magnitude smaller than the first gap G1, between the first gap G1 and the second gap G2, between the second gap G2 and third gap G3 or larger than the third gap G3 may be further included.

According to an exemplary embodiment, a half tone mask may not be used for forming the first spacer SP1, second spacer SP2, third spacer SP3, and fourth spacer SP4 having heights different from each other, so that a manufacturing time and a manufacturing cost may be reduced and productivity may be enhanced.

Figure 14:
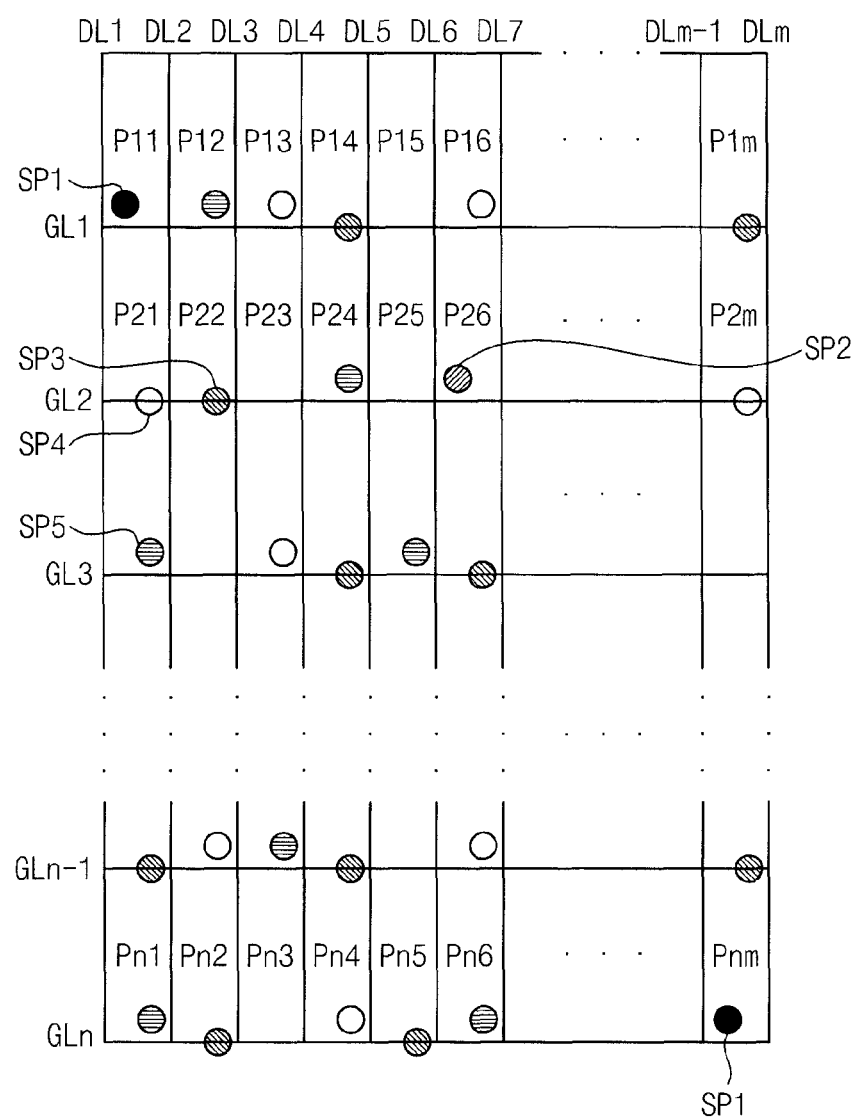
FIG. 14 is a plan view illustrating a display apparatus according to an exemplary embodiment of the present invention.
Figure 15:
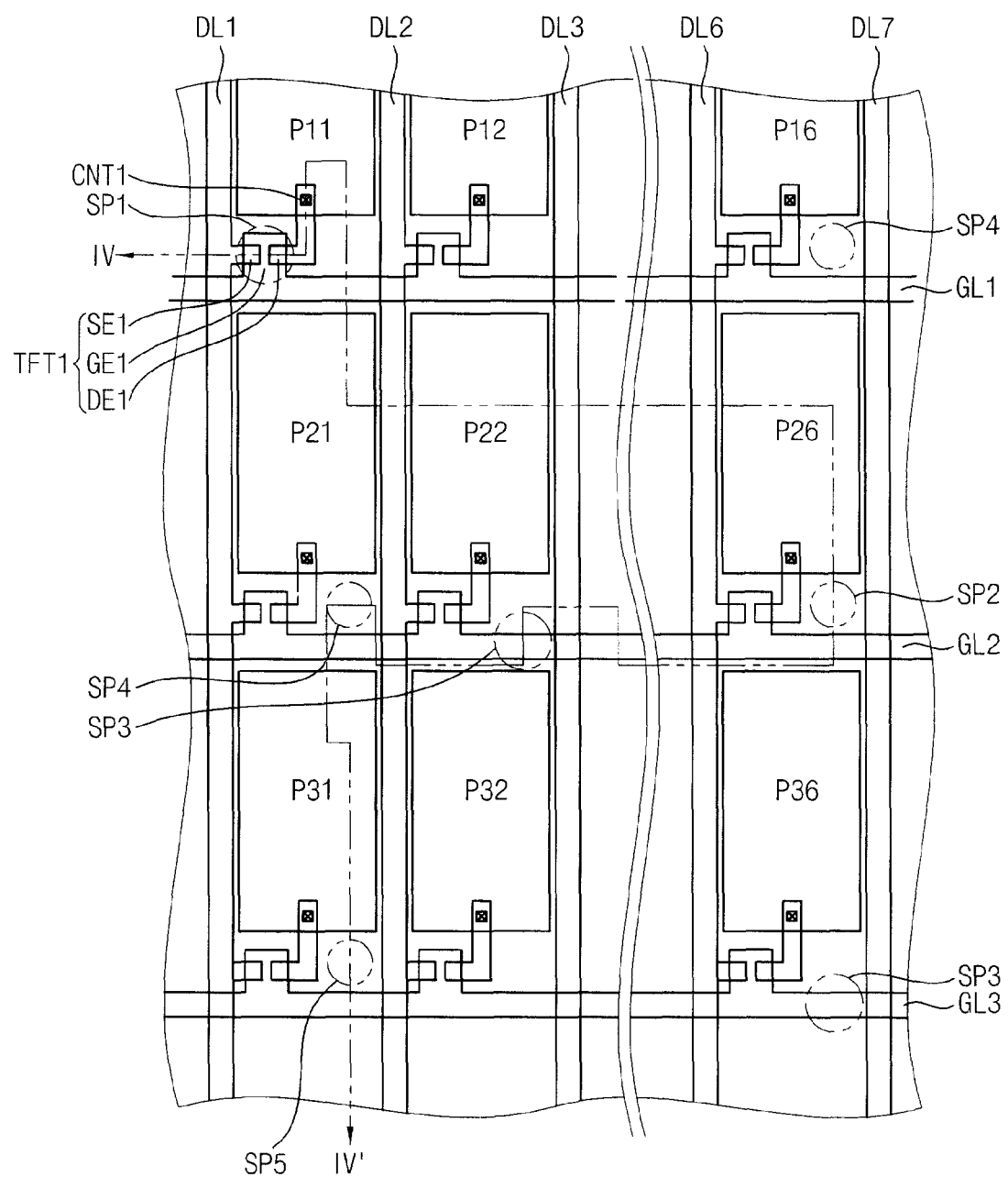
FIG. 15 is an enlarged plan view partially illustrating the display apparatus of FIG. 14.
Figure 16:
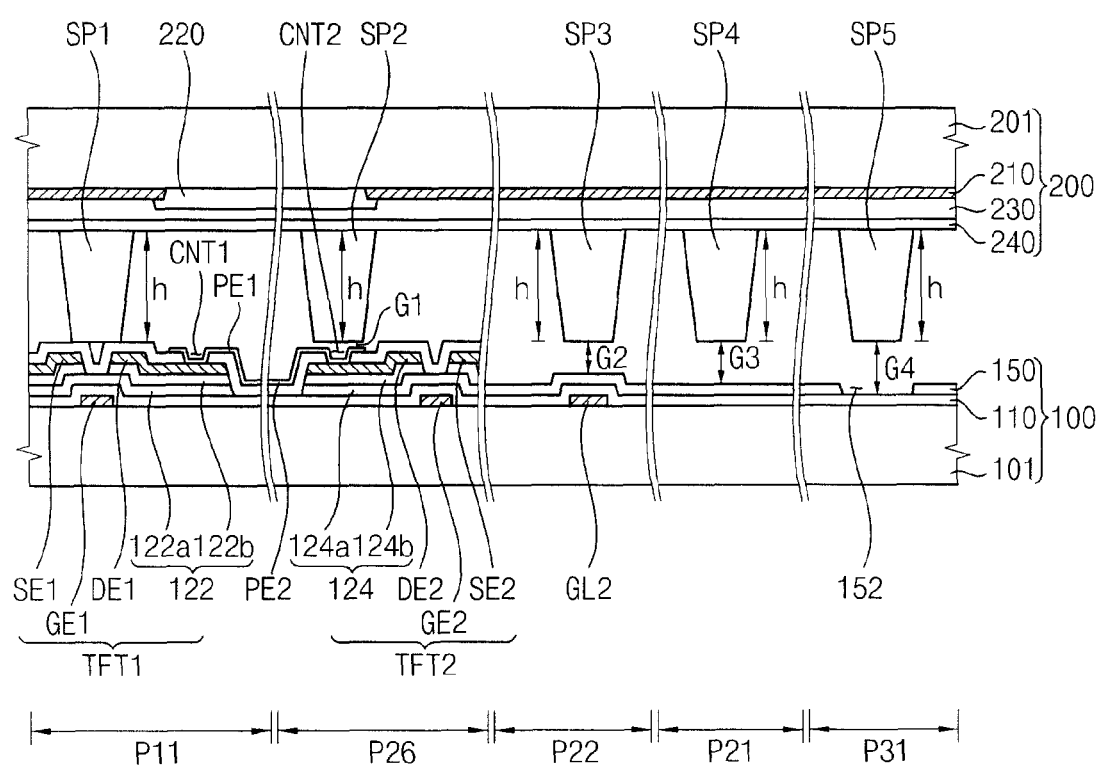
FIG. 16 is a cross-sectional view of the display apparatus taken along a line IV-IV' of FIG. 15.

FIG. 14 is a plan view illustrating a display apparatus according to an exemplary embodiment of the present invention. FIG. 15 is an enlarged plan view partially illustrating the display apparatus of FIG. 14. FIG. 16 is a cross-sectional view of the display apparatus taken along a line IV-IV' of FIG. 15.

Referring to FIG. 14, FIG. 15, and FIG. 16, a display apparatus according to an exemplary embodiment includes a display substrate 100, a counter substrate 200 facing the display substrate 100, and a liquid crystal layer 300 disposed between the display substrate 100 and the counter substrate 200.

A display apparatus according to an exemplary embodiment is substantially the same as the display apparatus described above with reference to FIG. 10, FIG. 11, FIG. 12, FIG. 13A, and FIG. 13B, except that the counter substrate 200 further includes a fifth spacer SP5, and a protective insulating layer 150 formed on the display substrate 100 includes a first hole 152 formed through the protective insulating layer 150 corresponding to the fifth spacer SP5. Thus, the same reference numerals will be used to refer to the same or like parts, and thus repetitive explanation will be omitted or briefly included.

The display substrate 100 may include a plurality of gate lines GL1 to GLn, a is plurality of data lines DL1 to DLm, a first switching element TFT1, a gate insulating layer 110, the protective insulating layer 150 and a first pixel electrode PE1 formed on a first base substrate 101. Here, n and m are natural numbers.

The protective insulating layer 150 is formed on the first base substrate 101 on which the first switching element TFT1 is formed. The protective insulating layer 150 includes a first contact hole CNT1 exposing a first drain electrode DE1 of the first switching element TFT1. The protective insulating layer 150 includes a first hole 152 exposing the gate insulating layer 110 in a fifth pixel area P31 corresponding to a third row and a first column.

The counter substrate 200 may include a blocking pattern 210, a color filter layer 220, an overcoating layer 230, a common electrode 240, a first spacer SP1, a second spacer SP2, a third spacer SP3, a fourth spacer SP4, and the fifth spacer SP5, formed on a second base substrate 201 facing the first base substrate 101.

The first spacer SP1 is formed over a channel portion of the first switching element TFT1 formed in the first pixel area P11 of the display substrate 100, and contacts the display substrate 100. The first spacer SP1 maintains a cell gap between the display substrate 100 and the contact substrate 200.

The second spacer SP2 is spaced apart from the display substrate 100 by a first gap G1, so that a margin in a liquid crystal injection process may be enhanced.

The third spacer SP3 is spaced apart from the display substrate 100 by a second gap G2 larger than the first gap G1.

The fourth spacer SP4 may be spaced apart from the display substrate 100 by a third gap G3 larger than the second gap G2.

The fifth spacer SP5 is formed over the first hole 152 formed through the is protective insulating layer 150 formed in the fifth pixel area P31. The fifth spacer SP5 may be spaced apart from the display substrate 100 by a fourth gap G4 larger than the third gap G3. For example, the fourth gap G4 may be equal to a sum of a thickness of the first gate electrode GE1 of the first switching element TFT1, a thickness of the first semiconductor pattern 122, a thickness of the first source electrode SE1 or the first drain electrode DE1, and a thickness of the protective insulating layer 150.

In an exemplary embodiment, a five spacer structure including the first spacer SP1, second spacer SP2, third spacer SP3, fourth spacer SP4, and fifth spacer SP5 is explained, but the present invention is not limited thereto. For example, although not shown in the figure, a spacer having a gap of magnitude between the first gap G1 and the fourth gap G4 or larger than the fourth gap G4 may be further included A method for manufacturing the display substrate 100 according to an exemplary embodiment is substantially the same as the method for manufacturing the display apparatus as described above with reference to FIG. 1, FIG. 2, FIG. 3, FIG. 4, FIG. 5A, FIG. 5B, FIG. 5C, FIG. 6A, and FIG. 6B, except that the protective insulating layer 150 forms a first hole 152, thus repetitive explanation will be omitted or briefly included.

The first hole 152 and a first contact hole CNT1 may be formed at the same time to expose the first drain electrode DE1.

A method for manufacturing the counter substrate 200 according to an exemplary embodiment is substantially the same as the method for manufacturing the counter substrate 200 as described above with reference to FIG. 10, FIG. 11, FIG. 12, FIG. 13A, and FIG. 13B, thus repetitive explanation will be omitted.

Figure 17:
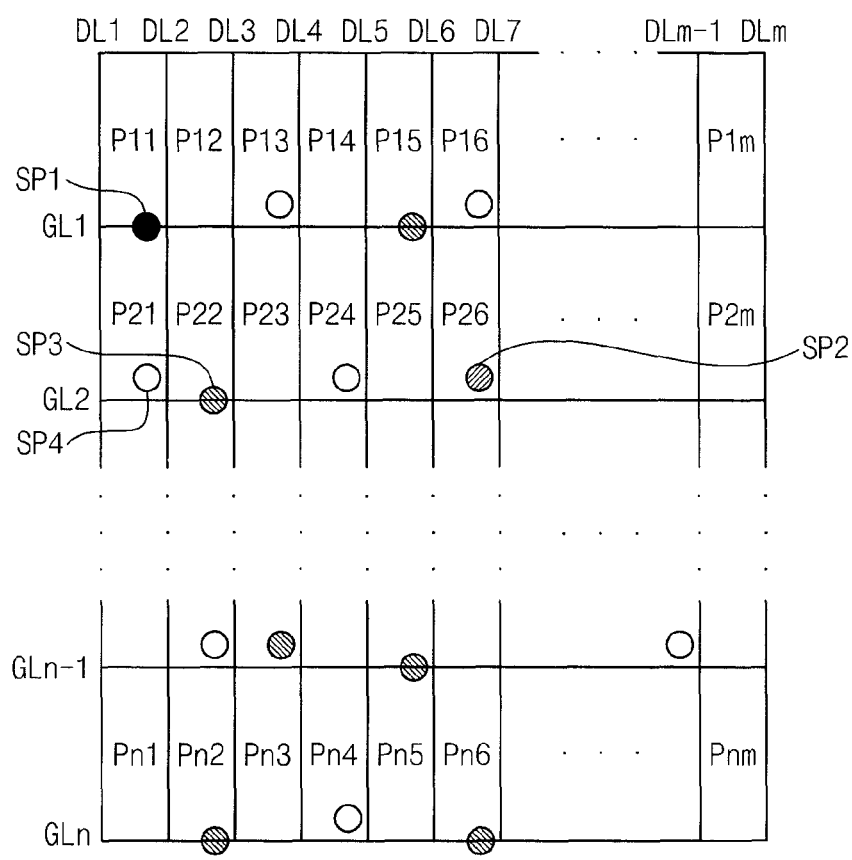
FIG. 17 is a plan view illustrating a display apparatus according to an exemplary embodiment of the present invention.
Figure 18:
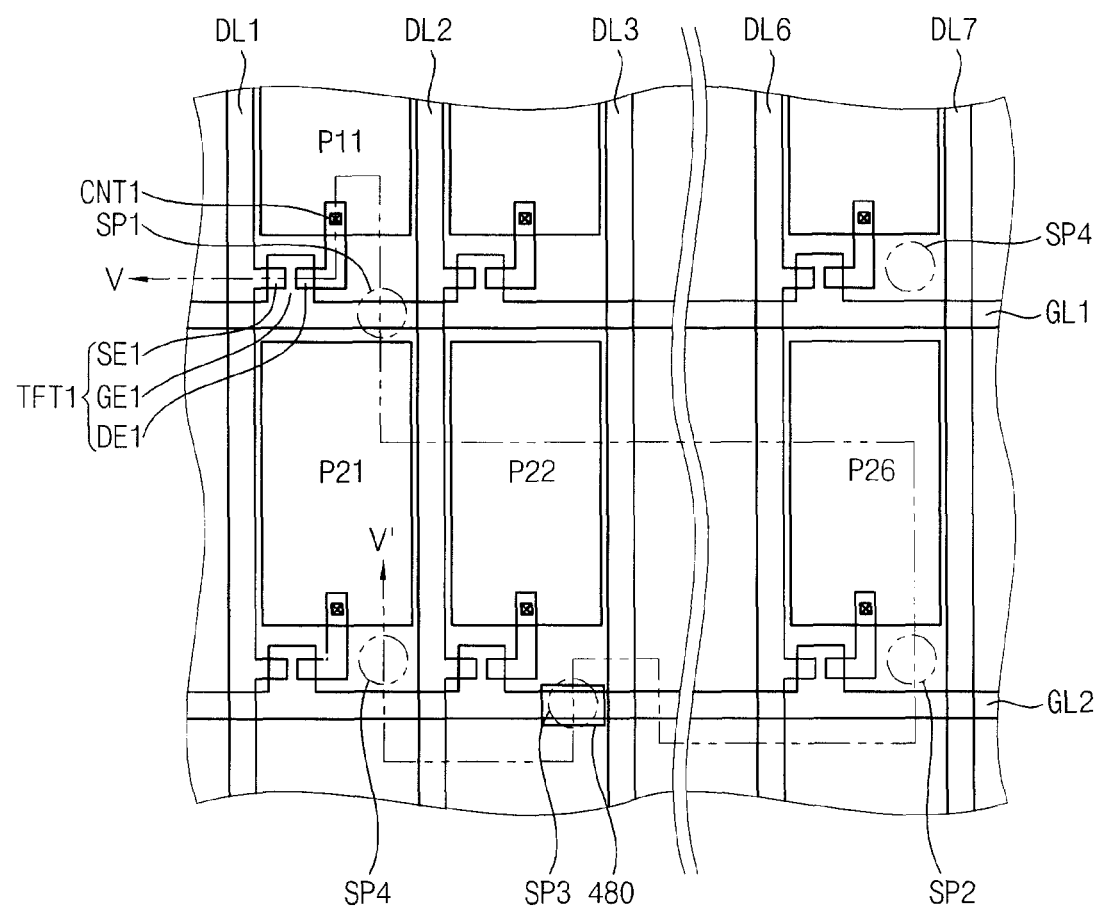
FIG. 18 is an enlarged plan view partially illustrating the display apparatus of FIG. 17.
Figure 19:
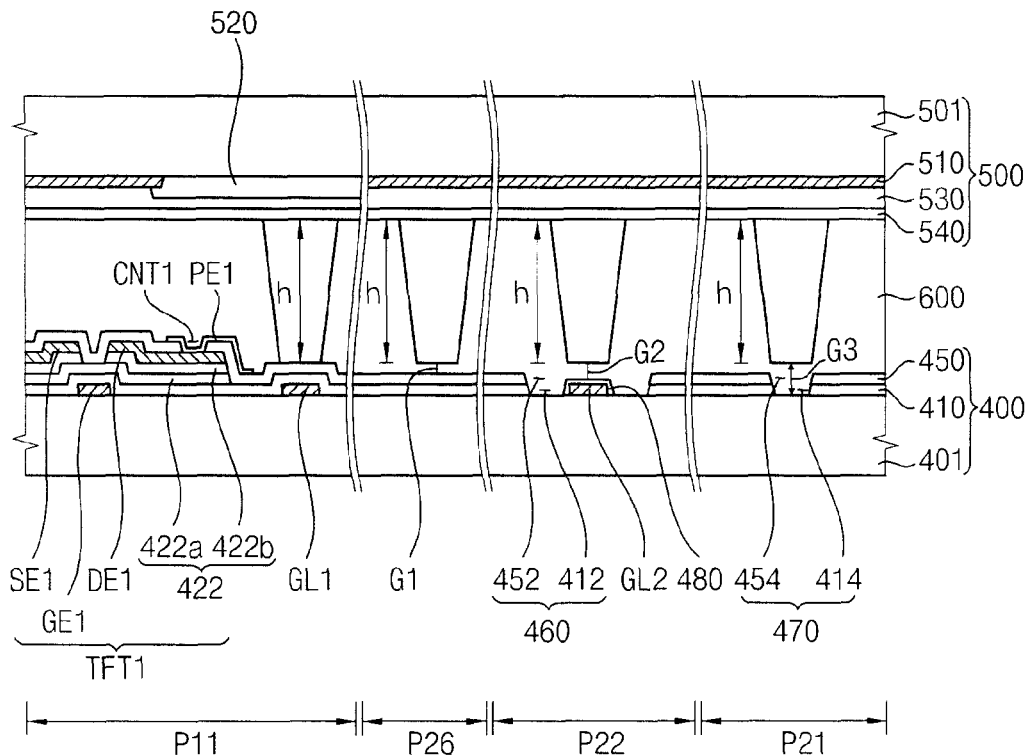
FIG. 19 is a cross-sectional view of the display apparatus taken along a line V-V' is of FIG. 18.

FIG. 17 is a plan view illustrating a display apparatus according to an exemplary is embodiment of the present invention. FIG. 18 is an enlarged plan view partially illustrating the display apparatus of FIG. 17. FIG. 19 is a cross-sectional view of the display apparatus taken along a line V-V' of FIG. 18.

Referring to FIG. 17, FIG. 18, and FIG. 19, a display apparatus according to an exemplary embodiment includes a display substrate 400, a counter substrate 500 facing the display substrate 400, and a liquid crystal layer 600 disposed between the display substrate 400 and the counter substrate 500.

The display substrate 400 may include a plurality of gate lines GLn, a plurality of data lines DLm, a first switching element TFT1, a gate insulating layer 410, a protective insulating layer 450, and a first pixel electrode PE1 formed on a first base substrate 401. A plurality of pixel areas P11 to Pnm is defined by the gate lines GL1 to GLn and the data lines DL1 to DLm. The pixel areas P11 to Pnm are arranged in a 2-dimensional array according to a plurality of row and a plurality of column. Here, n and m are natural numbers.

The first switching element TFT1 is formed in the first pixel area P11 according to a first row and a first column. The first switching element TFT1 includes a first gate electrode GE1, a first semiconductor pattern 422, a first source electrode SE1, and a first drain electrode DE1. The first gate electrode GE1 is connected to a first gate line GL1. The first semiconductor pattern 422 overlaps the first gate electrode GE1, and a gate insulating layer 410 is disposed between the first semiconductor pattern 422 and the first gate electrode GE1. The first semiconductor pattern 422 may include a first semiconductor layer 422a including an amorphous silicon and a first ohmic contact layer 422b including an amorphous silicon doped with N type dopants of a high concentration. The first source electrode SE1 is formed on the first semiconductor pattern 422 and makes contact with the first ohmic contact layer 422b. The first is drain electrode DE1 is spaced apart from the first source electrode SE1 and disposed on the first semiconductor pattern 422. An area where the first source electrode SE1 and the first drain electrode DE1 are spaced apart from each other is defined as a channel portion of the first switching element TFT1.

The gate insulating layer 410 is formed on the first base substrate 401 including the first gate electrode GE1, the first gate line GL1, and a second gate line GL2 adjacent to the first gate line GL1. The gate insulating layer 410 includes a first hole 412 exposing the second gate line GL2 formed in a third pixel area P22 corresponding to a second row and a second column, and a second hole 414 exposing the first base substrate 401 formed in a fourth pixel area P21 corresponding to a second row and a first column.

The protective insulating layer 450 is formed on the first base substrate 401 on which the first switching element TFT1 is formed. The protective insulating layer 450 includes a first contact hole CNT1 exposing the first drain electrode DE1. The protective insulating layer 450 includes a third hole 452 connected to the first hole 412 to expose the second gate line GL2 and a fourth hole 454 connected to the second hole 414 to expose the first base substrate 401. A first denting part 460 is defined by the first hole 412 and the third hole 452. A second denting part 470 is defined by the second hole 414 and the fourth hole 454.

The first pixel electrode PE1 is formed in the first pixel area P11, and may include a transparent conductive material. The first pixel electrode PE1 is electrically connected to the first drain electrode DE1 of the first switching element TFT1 through the first contact hole CNT1 formed through the protective insulating layer 450.

The display substrate 400 may further include a protective electrode 480.

The protective electrode 480 is formed on the second gate line GL2 exposed by is the first denting part 460 to cover the second gate line GL2. The protective electrode 480 protects the second gate line GL2 exposed by the first denting part 460. The protective electrode 480 may include a material substantially the same as the first pixel electrode PE1.

The counter substrate 500 may include a blocking pattern 510, a color filter layer 520, a overcoating layer 530, a common electrode 540, the first spacer SP1, the second spacer SP2, the third spacer SP3, and the fourth spacer SP4, formed on a second base substrate 501 facing the first base substrate 401.

The blocking pattern 510 is formed in boundary areas between pixel areas defined on the second base substrate 501, and prevents light leakage.

The color filter layer 520 is disposed in the pixel electrode areas. The color filter layer 520 may include a red color filter, a green color filter, and a blue color filter.

The overcoating layer 530 is formed on the second base substrate 501 on which the color filter layer 520 is formed.

The common electrode 540 includes a transparent conductive material, and is formed on the second base substrate 501 on which the overcoating layer 530 is formed.

The first spacer SP1, second spacer SP2, third spacer SP3, and fourth spacer SP4 are formed on the second base substrate 501 on which the common electrode 540 is formed. The first spacer SP1, second spacer SP2, third spacer SP3, and fourth spacer SP4 are disposed in areas different from each other. The first spacer SP1, second spacer SP2, third spacer SP3, and fourth spacer SP4 are substantially the same height h.

The first spacer SP1 is formed over a protective insulating layer 450 formed on the first gate line GL1, and contacts the protective insulating layer 450. The first gate line GL1 is formed in the first pixel area P11 of the first base substrate 401. The first spacer SP1 is maintains a cell gap between display substrate 400 and the counter substrate 500.

The second spacer SP2 is formed over the protective insulating layer 450 formed on the gate insulating layer 410. The gate insulating layer 410 is formed to make contact with the first base substrate 401 of the second pixel electrode P26 corresponding to the second row and the sixth column. The second spacer SP2 may be spaced apart from the display substrate 400 by a first gap G1. For example, the first gap G1 may be about 2000 Å corresponding to a thickness of the first gate electrode GE1. A margin in a liquid crystal injection process may be enhanced because the first gap G1 is formed between the first spacer SP1 and the second spacer SP2.

The third spacer SP3 is formed over the first denting part 460 formed in the third pixel area P22 of the first base substrate 401. The third spacer SP3 is spaced apart from the first base substrate 401 by a second gap G2 larger than the first gap G1. For example, the second gap G2 may be equal to a thickness of the gate insulating layer 410 plus a thickness of the protective insulating layer 450 minus a thickness of the protective electrode 480 formed on the second gate line GL2 exposed by the first denting part 460. For example, the second gap G2 may be about 0.5 μm. The thickness of the protective electrode 480 is thinner than the thickness of both the gate insulating layer 410 and the protective insulating layer 450.

The fourth spacer SP4 is formed over the second denting part 470 formed in the fourth pixel area P21 of the display substrate 400. The fourth spacer SP4 may be spaced apart from the first base substrate 401 by a third gap G3 larger than the second gap G2. For example, the third gap G3 may be about 0.7 μm. For example, the third gap G3 may be equal to a sum of a thickness of the first gate line GL1, a thickness of the gate insulating layer 410, and a thickness of the protective insulating layer 450.

A ratio of a density of the first spacer SP1 to a density of the second spacer SP2 may be about 1:N (N is natural number) or about N:1. For example, a ratio of a density of the first spacer SP1 to a density of the second spacer SP2 may be about 1:1, about 1:2, about 1:3, about 3:1, or about 2:1. The third spacer SP3 and fourth spacer SP4 are denser than the first spacer SP1 and second spacer SP2. If a liquid crystal panel is applied with an external pressure, the third spacer SP3 and fourth spacer SP4 disperse the external pressure. The third spacer SP3 and fourth spacer SP4 are uniformly distributed in pixel areas except the pixel areas in which the first spacer SP1 and second spacer SP2 are formed.

The first spacer SP1, second spacer SP2, third spacer SP3, and fourth spacer SP4 are substantially the same height h, but the first spacer SP1, second spacer SP2, third spacer SP3, and fourth spacer SP4 correspond to different gaps according to a height of a surface of the display substrate 400 facing the first spacer SP1, second spacer SP2, third spacer SP3, and fourth spacer SP4.

A method for manufacturing the counter substrate 500 according to an exemplary embodiment is substantially the same as described above with reference to FIG. 10, FIG. 11, FIG. 12, FIG. 13A, and FIG. 13B, thus repetitive explanation will be omitted.

Figure 20A:
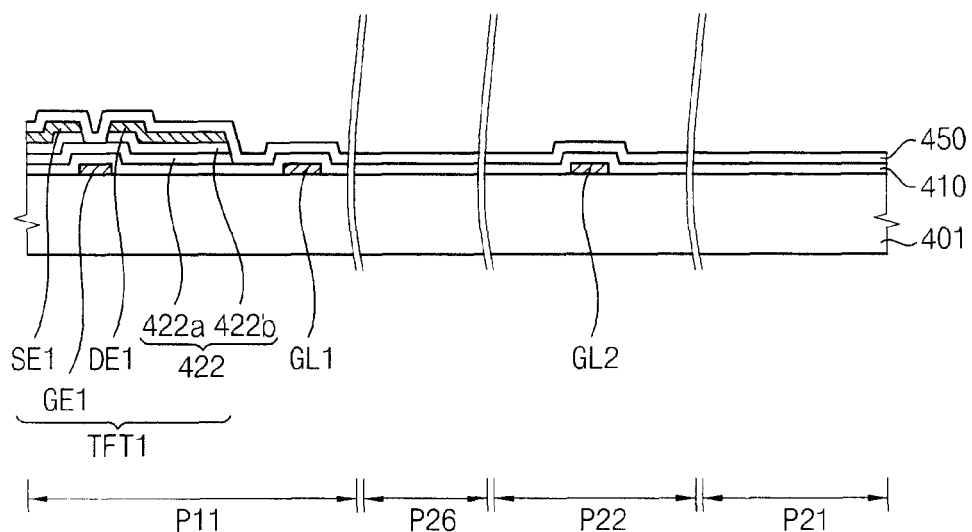
FIG. 20A, FIG. 20B, and FIG. 20C are cross-sectional views illustrating a method for manufacturing the display substrate of FIG. 19.
Figure 20B:
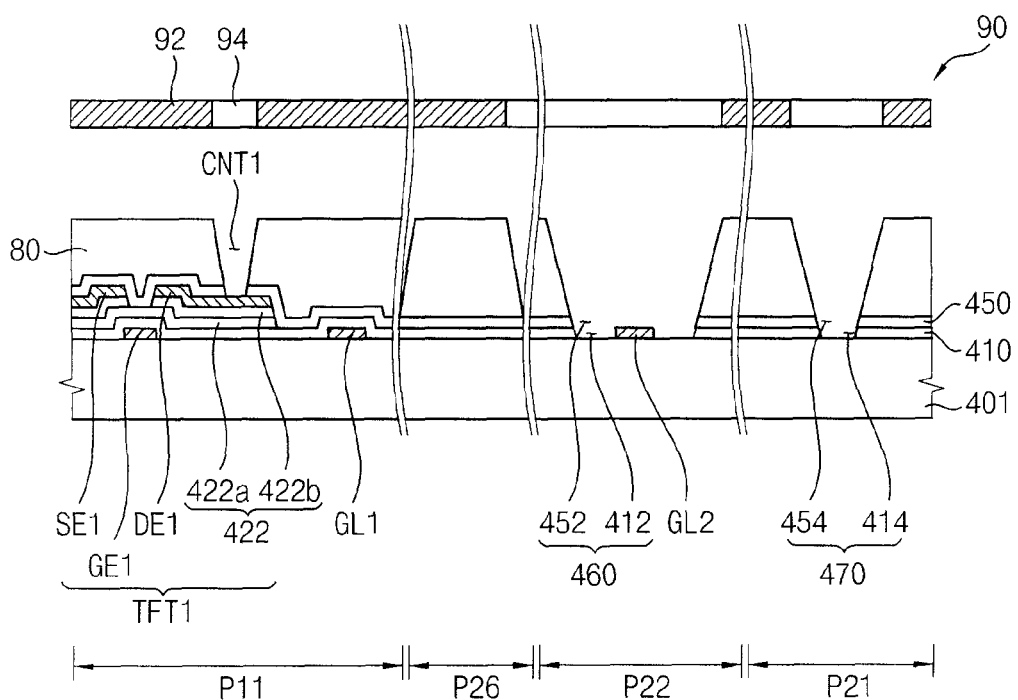
Figure 20C:
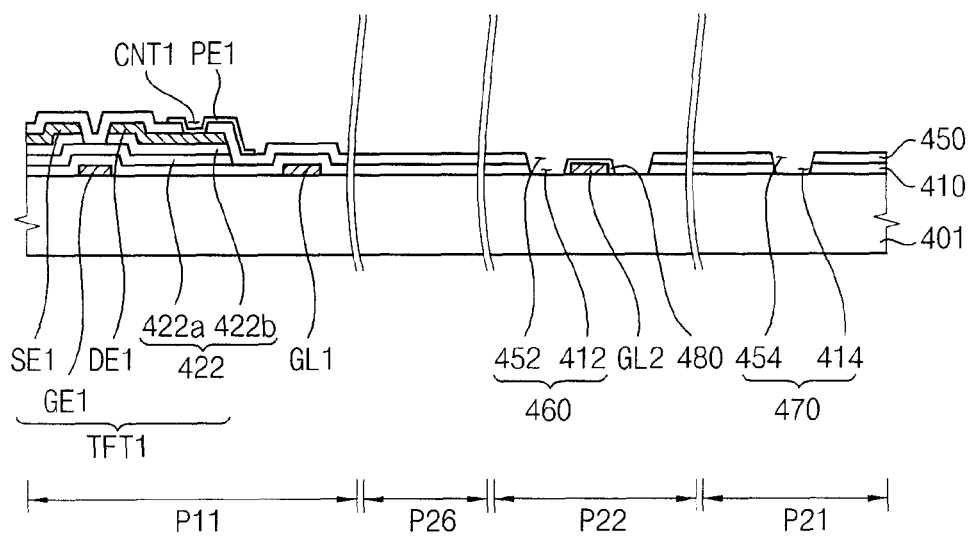

FIGS. 20A to 20C are cross-sectional views explaining the manufacturing process for a display substrate of FIG. 19.

Referring to FIG. 19 and FIG. 20A, a gate metal layer is formed on the first base substrate 401, and patterned to form a gate pattern including the first gate line GL1 and the second gate line GL2.

A gate insulating layer 410, a semiconductor layer, an ohmic contact layer and a source metal layer are sequentially formed on the first base substrate 401 including the gate pattern. The semiconductor layer, the ohmic contact layer and the source metal layer are patterned to form the first semiconductor pattern 422 and a source pattern. The source pattern includes the first source electrode SE1 disposed on the first semiconductor pattern 422 and a first drain electrode spaced apart from the first source electrode SE1. A process for forming the first semiconductor pattern 422 and the first source pattern is substantially the same as described above for forming the first semiconductor pattern 122 and the first source pattern with reference to FIG. 5A and FIG. 5B, thus repetitive explanation will be omitted.

The protective insulating layer 450 is formed on the first base substrate 401 on which the source pattern is formed.

Referring to FIG. 20B, a fourth photo pattern 80 is formed on the first base substrate 401 on which the protective insulating layer 450 is formed. After forming a photoresist layer including a light-sensitive material on the first base substrate 401 on which the protective insulating layer 450 is formed, a fourth mask 90 is disposed over the first base substrate 401 including the photoresist layer, light is irradiated to the fourth mask 90 and the fourth mask 90 is developed to form the fourth photo pattern 80. For example, the photoresist layer may be a positive type photoresist layer such that a portion of the photoresist layer irradiated by light is removed by a developer and a portion of the photoresist not irradiated by light is cured and remains on the first base substrate 401. In this case, the fourth mask 90 may include a blocking portion 92 and a transmissive portion 94. The transmissive portion 94 is disposed over the first contact hole CNT1, the first denting part 460, and the second denting part 470. The blocking portion 92 is disposed over an area not including the first contact hole CNT1, the first denting part 460, and the second denting part 470.

The protecting metal layer is then removed using the fourth photo pattern 80 as an is etching protection layer to form the first contact hole CNT1 exposing the first drain electrode DE1 in the first pixel area P11, the third hole 452 exposing the gate insulating layer 410 in the third pixel area P22, and the fourth hole 454 exposing the gate insulating layer 410 in the fourth pixel area P21.

The gate insulating layer 410 is removed using the fourth photo pattern 80 as an etching protection layer to form the first hole 412 connected to the third hole 452 and exposing the first gate line GL1, and to form the second hole 414 connected to the fourth hole 454 in the fourth pixel area P21 and exposing the first base substrate 401. The first hole 412 and the third hole 452 define the first denting part 460, and the second hole 414 and the fourth hole 454 define the second denting part 470.

Referring to FIG. 20C, after forming a transparent electrode layer on the first base substrate 401 on which the protective insulating layer 450 is formed, the transparent electrode layer is patterned to form the first pixel electrode PE1 and the protective electrode 480. The first pixel electrode PE1 is electrically connected to the first drain electrode DE1 of the first switching element TFT1 through the first contact hole CNT1. The first protective electrode is formed to cover the second gate line GL2.

In an exemplary embodiment, a four spacer structure including the first spacer SP1, second spacer SP2, third spacer SP3, and fourth spacer SP4 is explained, but the present invention is not limited thereto. For example, although not shown in the figure, a spacer having a gap of magnitude between the first gap G1 and the third gap G3 or larger than the third gap G3 may be further included.

According to exemplary embodiments of the present invention, a four-spacer structure includes the first spacer SP1, second spacer SP2, third spacer SP3, and fourth spacer SP4. The first spacer SP1 and second spacer SP2 maintain the cell gap, and guarantee a margin in a liquid crystal injection process. The third spacer SP3 and fourth spacer SP4 guarantee a tolerance with respect to external pressure. According to the structure, a margin in a liquid crystal injection process and a tolerance with respect to the external pressure that are in a trade-off relation may be optimized.

In addition, a half tone mask may not be used for forming the first spacer SP1, second spacer SP2, third spacer SP3, and fourth spacer SP4 having heights different from each other, so that a manufacturing time and a manufacturing cost may be reduced and productivity may be enhanced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a display apparatus, the method comprising:
    providing a display substrate comprising pixel electrodes disposed on a first substrate;
    providing a counter substrate comprising:
        a common electrode disposed on a second substrate;
        a first spacer disposed on the common electrode, the first spacer having a first height;
        a second spacer disposed on the common electrode, the second spacer having a second height that is less than the first height;
        a third spacer disposed on the common electrode, the third spacer having a third height that is substantially equal to the first height; and
        a fourth spacer disposed on the common electrode, the fourth spacer having a fourth height that is substantially equal to the second height; and
    combining the display substrate and the counter substrate such that the first spacer contacts the display substrate, the second spacer is spaced apart from the display substrate by a first gap, the third spacer is spaced apart from the display substrate by a second gap larger than the first gap, and the fourth spacer is spaced apart from the display substrate by a third gap larger than the second gap, when the counter substrate is in a non-deformed state.

2. The method of claim 1, wherein the first spacer, the second spacer, the third spacer, and the fourth spacer are disposed in areas different from each other.

3. The method of claim 2, wherein forming the display substrate comprises:
    forming a gate line on the first substrate;
    forming a data line on the first substrate, the data line positioned to cross the gate line; and
    forming a switching element on the first substrate, the switching element being connected to the gate line and the data line,
    wherein each of the first spacer and the second spacer is disposed over a channel portion of the switching element, and each of the third spacer and the fourth spacer is disposed over the gate line.

4. A method for manufacturing a display apparatus, the method comprising:
    providing a display substrate comprising pixel electrodes disposed on a first substrate; and
    forming a counter substrate comprising:
        a common electrode disposed on a second substrate;
        a first spacer disposed on the common electrode;
        a second spacer disposed on the common electrode;
        a third spacer disposed on the common electrode; and
        a fourth spacer disposed on the common electrode; and
    combining the display substrate with the counter substrate, such that the first spacer contacts the display substrate, the second spacer is spaced apart from the display substrate by a first gap, the third spacer is spaced apart from the display substrate by a second gap larger than the first gap, and the fourth spacer is spaced apart from the display substrate by a third gap larger than the second gap, when the counter substrate is in a non-deformed state,
    wherein the first spacer, the second spacer, the third spacer, and the fourth spacer have substantially equal height.

5. The method of claim 4, wherein forming the display substrate comprises:
    forming a gate pattern on the first substrate, the gate pattern comprising a first gate line and a gate electrode of a switching element;
    forming a gate insulating layer on the gate pattern;
    forming a semiconductor pattern and a source pattern on the semiconductor pattern by patterning a semiconductor layer formed on the first substrate having the gate insulating layer formed thereon and a source metal layer, the source pattern comprising a data line crossing the first gate line, a source electrode connected to the data line, and a drain electrode spaced apart from the source electrode;
    forming a protective insulating layer on the first substrate having the source pattern formed thereon;
    forming a contact hole exposing the drain electrode by removing a portion of the protective insulating layer; and
    forming a pixel electrode electrically connected to the drain electrode of the switching is element through the contact hole.

6. The method of claim 5, wherein the first spacer is disposed over a channel portion of the switching element, the second spacer is disposed over the data line, the third spacer is disposed over a second gate line, and the fourth spacer is disposed over the protective insulating layer disposed on the gate insulating layer disposed on the first substrate.

7. A method for manufacturing a display apparatus, the method comprising:
    providing a display substrate comprising pixel electrodes disposed on a first substrate;
    forming a gate pattern on the first substrate, the gate pattern comprising a first gate line and a gate electrode of a switching element;
    forming a gate insulating layer on the gate pattern;
    forming a semiconductor pattern and a source pattern on the semiconductor pattern and a source metal layer, the source pattern comprising a data line crossing the first gate line, a source electrode connected to the data line, and a drain electrode spaced apart from the source electrode;
    forming a protective insulating layer on the first substrate having the source pattern formed thereon;
    forming a contact hole exposing the drain electrode by removing a portion of the protective insulating layer;
    forming a first hole exposing a second gate line by removing the protective insulating layer and the gate insulating layer;

forming a second hole exposing the first substrate by removing the gate insulating layer; and forming a pixel electrode electrically connected to the drain electrode of the switching element through the contact hole;

providing a counter substrate comprising:
- a common electrode disposed on a second substrate;
- a first spacer disposed on the common electrode;
- a second spacer disposed on the common electrode;
- a third spacer disposed on the common electrode; and
- a fourth spacer disposed on the common electrode; and combining the display substrate with the counter substrate, such that the first spacer contacts the display substrate, the second spacer is spaced apart from the display substrate by a first gap, the third spacer is spaced apart from the display substrate by a second gap larger than the first gap, and the fourth spacer is spaced apart from the display substrate by a third gap larger than the second gap, when the counter substrate is in a non-deformed state, wherein the first spacer, the second spacer, the third spacer, and the fourth spacer have substantially equal height.

8. The method of claim 7, further comprising forming a protective electrode on second gate line exposed by the first hole.

9. The method of claim 8, wherein the protective electrode is formed to cover the second gate line.

10. The method of claim 8, wherein the first spacer is disposed over the first gate line, the second spacer is disposed over the protective insulating layer, the third spacer is disposed over the first hole, and the fourth spacer is formed over the second hole.

* * * * *